United States Patent [19]
Knutson

[11] Patent Number: 5,388,062
[45] Date of Patent: Feb. 7, 1995

[54] RECONFIGURABLE PROGRAMMABLE DIGITAL FILTER ARCHITECTURE USEFUL IN COMMUNICATION RECEIVER

[75] Inventor: Paul G. Knutson, Indianapolis, Ind.

[73] Assignee: Thomson Consumer Electronics, Inc., Indianapolis, Ind.

[21] Appl. No.: 58,903

[22] Filed: May 6, 1993

[51] Int. Cl.$^6$ .............................. G06F 15/31
[52] U.S. Cl. ..................... 364/724.2; 364/724.01; 364/724.16; 364/724.17
[58] Field of Search ............. 364/724.01, 724.13, 364/724.16, 724.17, 724.19, 724.2

[56] References Cited

U.S. PATENT DOCUMENTS 5,005,185  4/1991  Mizoguchi et al. .............. 364/724.2
5,224,123  6/1993  Iga et al. ........................ 364/724.2

OTHER PUBLICATIONS

Zoran Corp. Technical Specification Sheet entitled "Television Ghost Canceler Chip Set", Apr. 1993.
Edwards, B. et al., "A Single Chip Video Ghost Canceller", IEEE 1992 Custom Integrated circuits Conference; pp. 26.5.1–26.5.4.

Primary Examiner—David H. Malzahn
Attorney, Agent, or Firm—Joseph S. Tripoli; Eric P. Herrmann; Ronald H. Kurdyla

[57] ABSTRACT

A VLSI integrated circuit, which comprises a single IIR input and global section and identically-structured cascadable filter sections, each of which filter sections includes a pair of time-multiplexed, real-coefficient, input-weighted FIR filter units and additional delay means, can be selectively programmed to operate in any one of a number of different filter configurations that can define real FIR or IIR filters, complex FIR or IIR filters, or filters which are various combinations thereof. One or more of such integrated circuits are useful for implementing a digital deghosting and/or equalization filter.

17 Claims, 23 Drawing Sheets

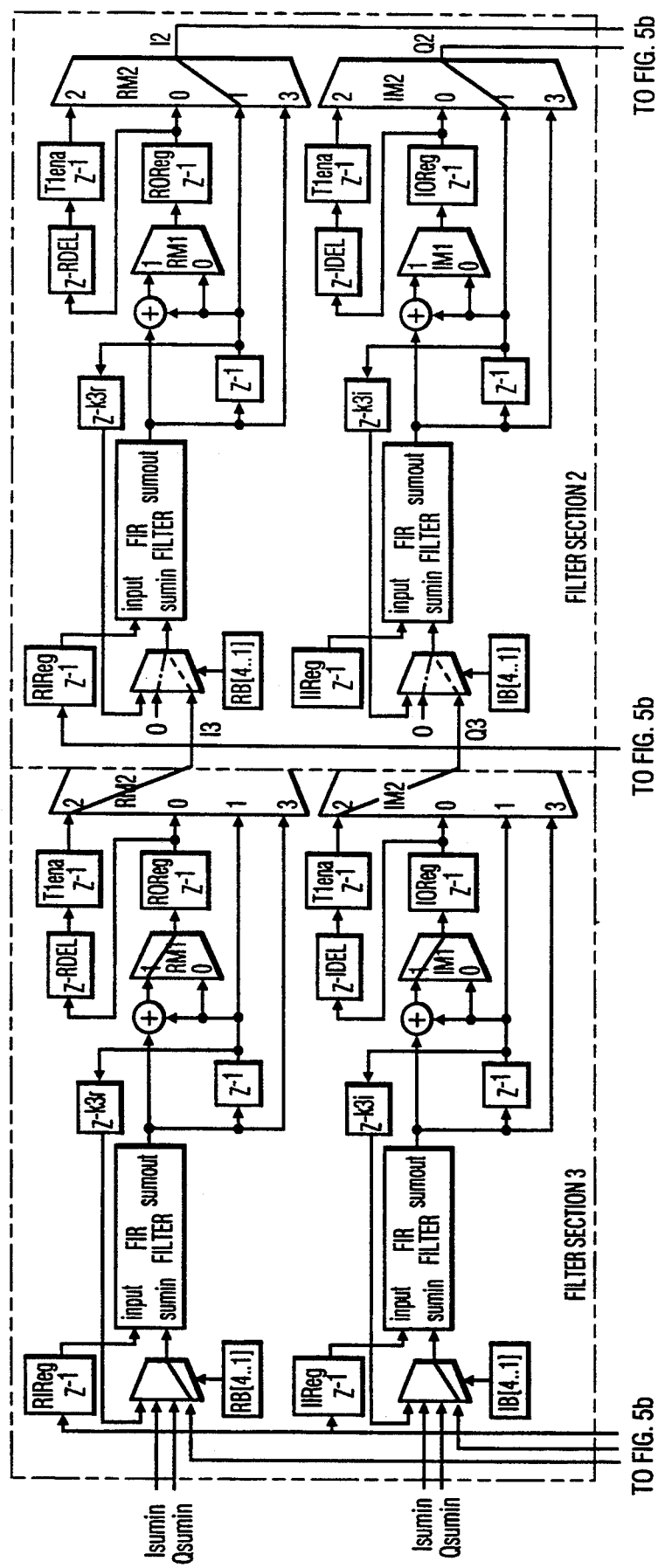

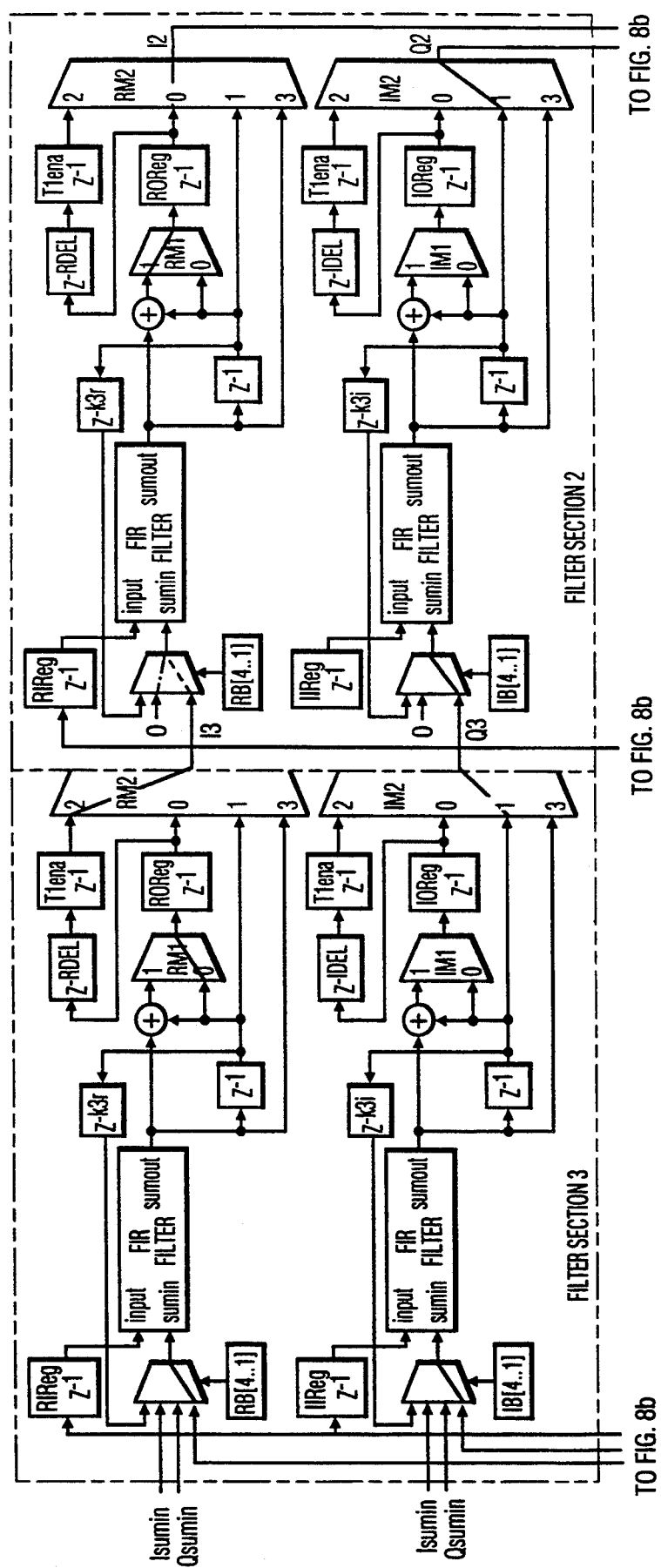

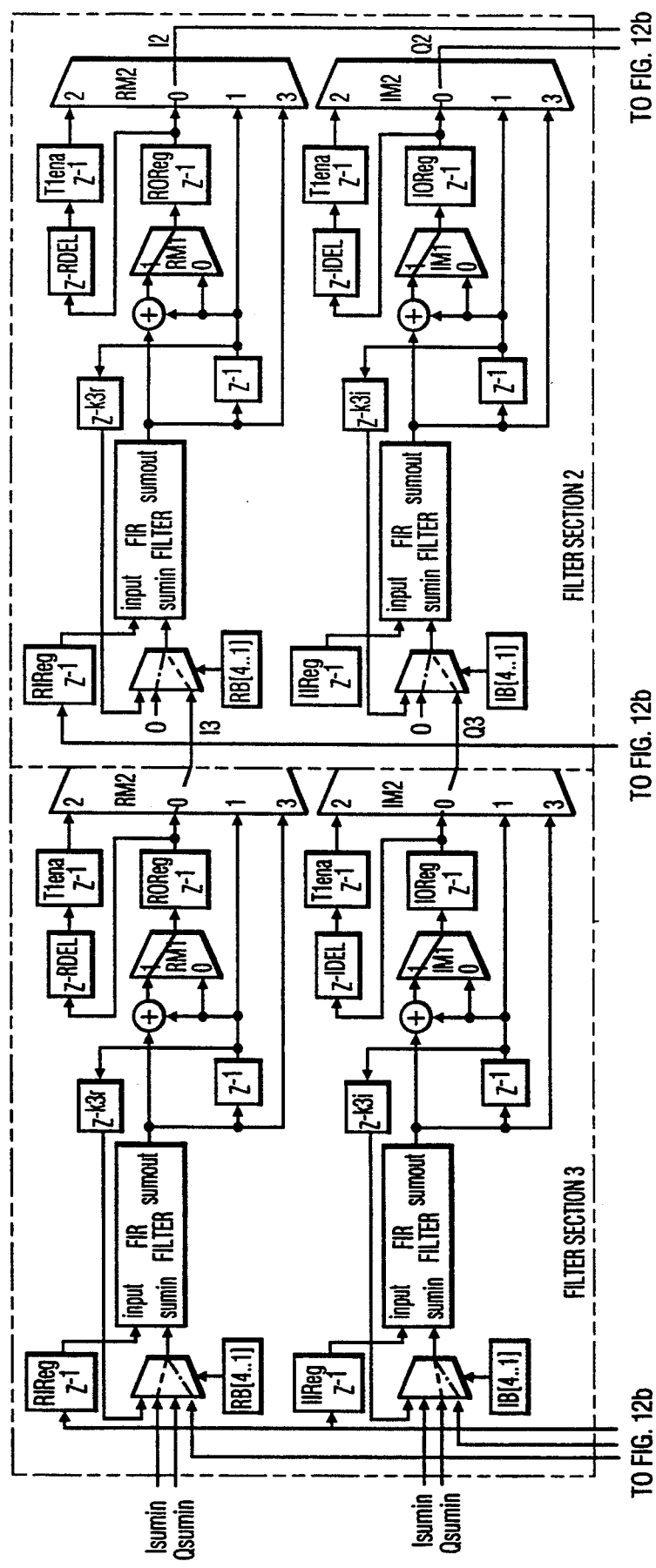

5,388,062

RECONFIGURABLE PROGRAMMABLE DIGITAL FILTER ARCHITECTURE USEFUL IN COMMUNICATION RECEIVER

BACKGROUND OF THE INVENTION

Modes of communicating information between a transmitter and one or more receivers may be accomplished by terrestrial broadcast, by satellite, and/or by cable. Such communicated information includes analog NTSC television signals, digital HDTV television signals and digital mobile telephone signals, by way of examples. The received signal may be distorted with respect to the transmitted signal due to multipath effects or other signal transmission effects. As known, such distortion may be minimized at the receiver by means of a suitable equalization filter thereat. In particular, so-called deghosting filters may be used as a multipath equalization filter to minimize multipath distortion displayed by a television receiver. One example of such deghosting filter, which is implemented in digital form, is disclosed in U.S. Pat. No. 5,065,242, which issued to Dieterich et al. on Nov. 11, 1991, the teachings of which are incorporated herein by reference.

The specific filter characteristics of a deghosting filter or other type of equalization filter of each individual television set, mobile telephone, or other type of communication receiver incorporating such a filter preferably are tailored to that particular receiver in order to be effective in minimizing the distortion of the signal received thereby. However, television sets and mobile telephones are massed-produced items in which cost also must be minimized. What is needed is a single integrated circuit (chip) architecture which permits one or more of such chips to efficiently and economically implement a reconfigurable programmable digital filter having characteristics of a deghosting filter or any other type of equalization filter that may be separately tailored for use in each individual receiver of any type of communication equipment.

SUMMARY OF THE INVENTION

The invention is directed to filter architecture which may be implemented as an integrated circuit. The architecture comprises means including multiplexer means combined with first and second input-weighted digital filter units each of which has a given number of multiplier-coefficient taps that provides a reconfigurable programmable digital filter suitable for use as a deghosting filter. The first and second digital filter units can be configured with this combination for operation either as a single complex digital filter unit with the given number of complex multiplier coefficients for a complex sampled input signal or, alternatively, at least one of the two digital filter units filter units can be configured with this combination for operation as a separate real digital filter unit with twice the given number of real multiplier coefficients for a real sampled input signal.

DESCRIPTION OF THE PREFERRED EMBODIMENTS

Overview:

A digital channel equalization and deghosting filter for either HDTV or NTSC signals must adapt to any combination of preghost, postghost, and other linear channel impairments in a channel that is then being received. These filter types are needed to accomplish attenuation of post ghosts, preghosts, and channel equalization using a variety of algorithms. Channel equalization is accomplished by dense Finite Impulse Response (FIR) filters; postghost cancellation is accomplished by sparse Infinite Impulse Response (IIR) filters, and pre-ghost attenuation is accomplished by sparse FIR filters. Further, while the values of digitized NTSC signals are defined by only real values and require only real-valued digital filters, digitized HDTV signals are complex and require complex-valued digital filters. The present invention is directed to a versatile filter architecture that enables various combinations of the above-described filter modes to be configured on a single VLSI chip without physically rewiring the chip. This not only provides a low cost single filter integrated circuit (IC) that allows for selection of the optimal filter topology for a given input signal.

Figure 1:
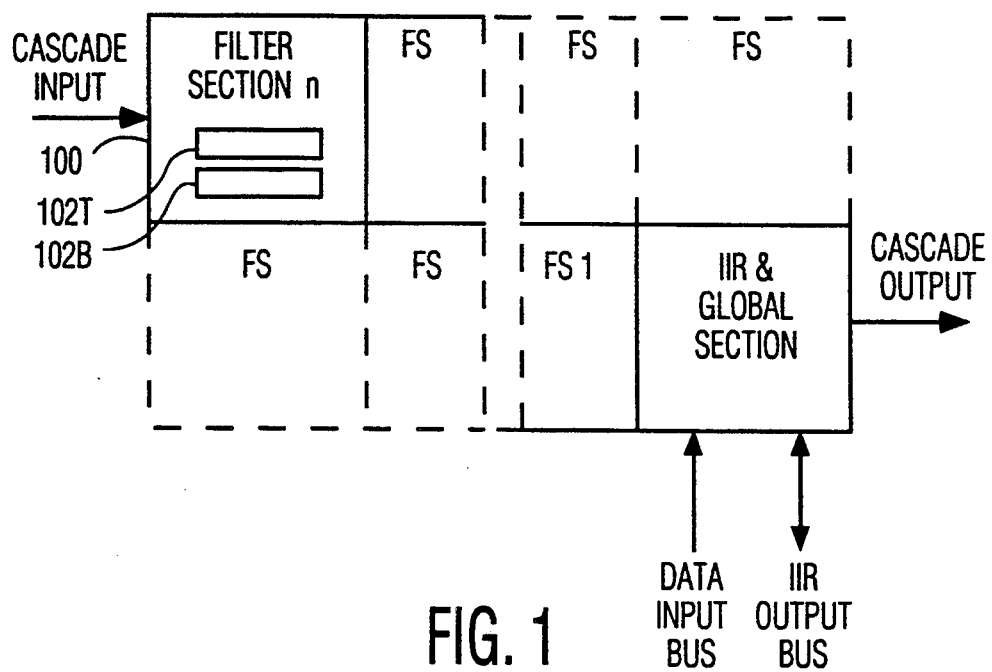
FIG. 1 diagramatically illustrates an overview of the architecture of an (n+1) section VLSI chip suitable for efficiently implementing a reconfigurable programmable deghosting filter having n filter sections, and FIG. 1a diagrammatically illustrates an arrangement employing a plurality of such chips.

Referring now to FIG. 1, there is diagrammatically shown a VLSI chip 100 area divided into (n+1) subareas consisting of a single IIR input and global section subarea and filter section (FS) subareas 1 through n, in which all filter sections have identical architectures. The data input bus provides input data to the transposed architecture filter in a FIR configuration. The IIR output bus provides the output of an IIR adder to the input of a transposed architecture filter for IIR filter implementations. The bus is indicated as bidirectional since a configurable multichip system may have the IIR adder located on any of the n chips. In principle, n could have a value as small as one (i.e., VLSI chip 100 could comprise only a single filter section). However, in practice, the value of n is normally larger than one (VLSI chip 100 normally comprises a given plurality of filter sections). In an actually designed VLSI chip, the value of n is five. However, for illustrative purposes in describing the present invention, it is assumed in the examples shown in FIGS. 4a, 4b and 5 to 12 that the value of n is only three.

Each of the n filter sections of chip 100 includes a pair of input-weighted filter units 102T and 102B that are shown in FIG. 1. In addition, each of these n filter sections comprises other structure including input multiplexers, routing multiplexers, registers, and bulk delay means that are not shown in FIG. 1 but are shown and described in detail below in connection with FIGS. 2, 2a, 3, 3a, 4a, 4b and 5 to 12. The IIR input and global section of chip 100, is shown and described in detail below in connection with FIGS. 4a, 4b and 5 to 12, includes routing multiplexers and other structure (a) for selectively interconnecting the n filter sections, (b) for selectively operating none, part or all of the n filter sections as FIR filters and/or operating none, part or all of the n filter sections as IIR filters, and (c) for selectively controlling the filter section output which is forwarded to the cascade output of chip 100. In FIGS. 4a, 4b and 5-12, with regard to multiplexer operation, a solid connection line designates a constant connection, a line composed of short dashes designates a connection in time T0, and a line composed of long dashes designates a connection in time T1.

Figure 1A:
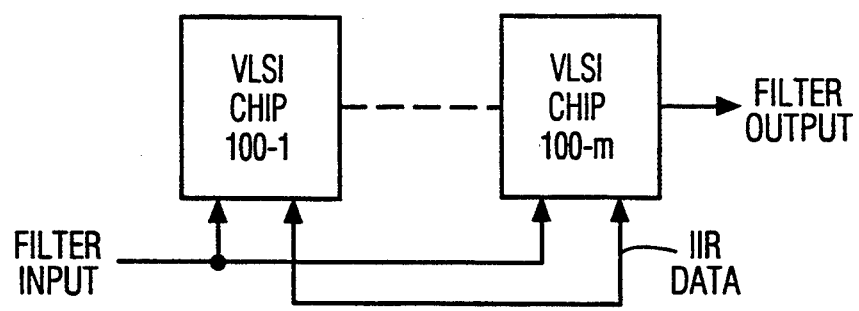

A single chip 100 is all that is needed for the case of a deghosting and/or equalization filter requiring n or fewer filter sections. In the case of a a deghosting and/or equalization filter requiring more than n filter sections, a given plurality of chips 100-1 to 100-m may be cascaded, as shown in FIG. 1a. In this case the cascade output of each chip except that of the last chip 100-m is forwarded to the cascade input of each chip except that of first chip 100-1.

Figure 2:
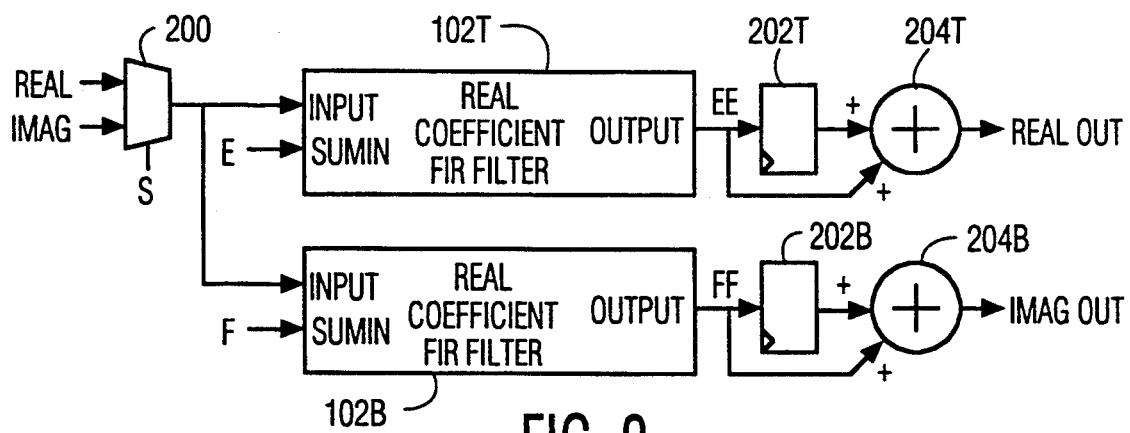
FIG. 2 diagrammatically illustrates a first configuration of a pair of real-coefficient FIR filter units employed in each of the n filter sections of FIG. 1.
Figure 3:
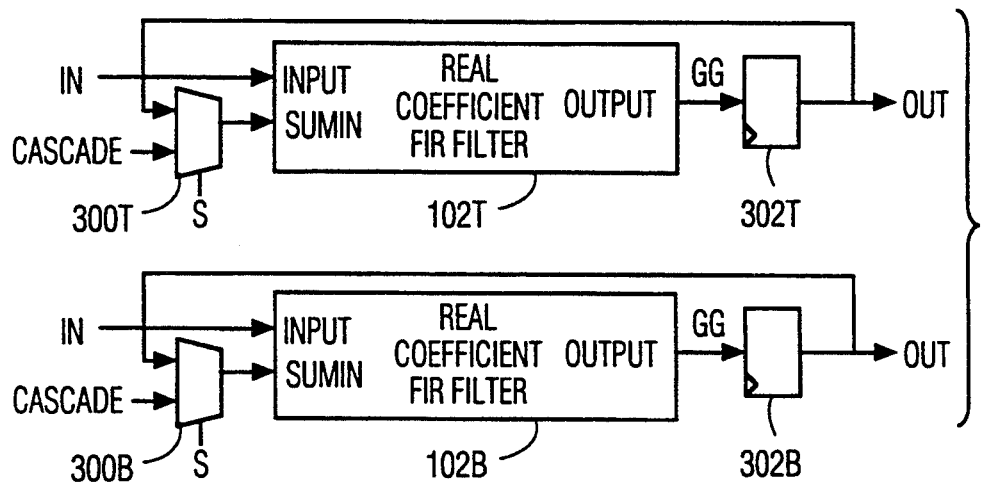
FIG. 3 diagrammatically illustrates a second configuration of the pair of real-coefficient FIR filter units employed in each of the n filter sections of FIG. 1.

Complex and Real Configurations of Filter Units 102T and 102B:

The pair of filter units 102T and 102B may be alternatively configured to operate as a single complex-coefficient input-weighted digital filter having a given number of taps for a complex input signal, as shown in FIG. 2, or to operate as two independent real-coefficient input-weighted digital filters having twice the given number of taps for two independent real input signals, as shown in FIG. 3, or to operate as four independent real-coefficient input-weighted digital filters each having the given number of taps for four independent real input signals.

Figure 2A:
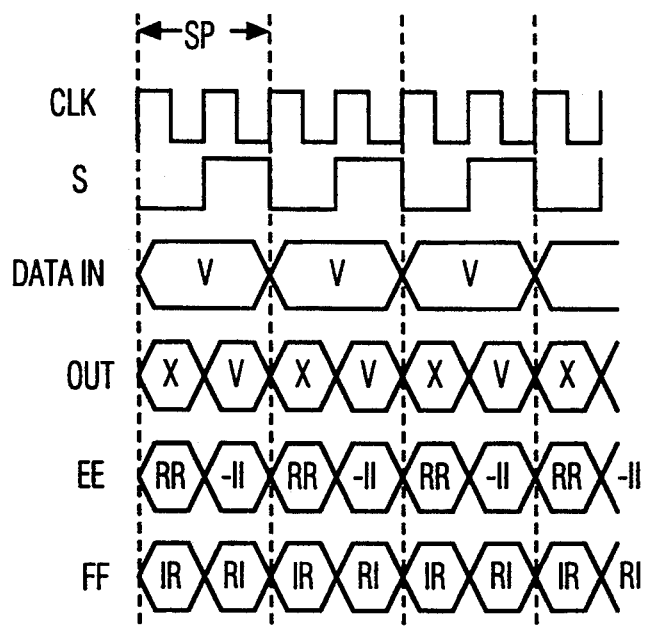
FIG. 2a is a timing diagram indicative of the operation thereof.

Reference is made to FIG. 2, which shows top real-coefficient FIR filter unit 102T and bottom real-coefficient FIR filter unit 102B associated with an input multiplexer 200, and to FIG. 2a, which is a timing diagram indicative of the operation of the FIG. 2 structure. Each of filter units 102T and 102B is a multitap input-weighted filter having two multiplier-accumulator registers associated with each tap, as indicated in FIG. 2. Input signals are provided from a source of television signal video component for example, and output signals are provided to video signal processing circuits in a television signal receiver for example. Successive Real (R) and Imaginary (I) input data samples are respectively applied to first and second inputs of multiplexer 200 at a given sample rate that is one-half the filter clock (Clk) rate. Multiplexer 200, in response to Clk applied to the switch (S) input thereof, forwards an R input data sample to the inputs of both filter units 102T and 102B during the first Clk period of each successive sample period (designated SP in FIG. 2a) and forwards an I input data sample to the inputs of both filter units 102T and 102B during the second Clk period of each successive sample period. Although not specifically shown in FIG. 2, during the first Clk period, an appropriately-valued multiplier coefficient R is applied to the first of the two multiplier-accumulator registers associated with each tap of filter unit 102T and each tap of filter unit 102B. During the second Clk period, the negative of an appropriately-valued multiplier coefficient -I is applied to the second of the two multiplier-accumulator registers associated with each tap of filter unit 102T and an appropriately-valued multiplier coefficient R is applied to the second of the two multiplier-accumulator registers associated with each tap of filter unit 102B.

The value of a complex multiplier coefficient c involves both a real value R and an imaginary value I and a complex input sample i also involves both a real value R and an imaginary value I. Therefore, the product $(R+jI)_c(R+jI)_i$ of the complex coefficient c times the complex input sample i is equal to $(RcRi-IcIi)+j(-RcIi+IcRi)$. It usually requires four digital filter units to perform this involved complex product computation. However, filter units 102T and 102B, by employing time-multiplexed coefficients and two multiplier-accumulator registers between taps, permits this involved complex product computation to be performed with only the two filter units 102T and 102B.

In particular, the sample output from filter 102T during the first Clk period of each sample period is RR and during the second Clk period of each sample period is -II. Together, they represent the real portion of each complex output sample, shown as EE in the FIG. 2a timing diagram. Similarly, the sample output from filter 102B during the first Clk period of each sample period is RI and during the second Clk period of each sample period is IR. Together, they represent the imaginary portion of each complex output sample, shown as FF in the FIG. 2a timing diagram.

Figure 2B:
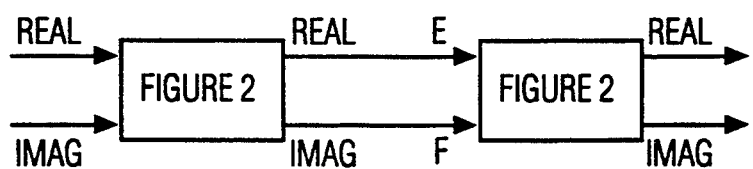
FIG. 2b diagrammatically illustrates the cascading of two of the n filter sections of FIG. 1 in which each of the two cascaded filter sections has the configuration of FIG. 2.

In a designed chip, each of filter units 102T and 102B comprises only three taps. For this reason, a whole filter usually comprises a plurality of cascaded filter units on a single chip, shown in FIG. 2b, or, in some cases, on a plurality of cascaded chips. The real cascade output of a corresponding filter unit 102T of a preceding filter section, designated E, can be forwarded to the sumin input of the filter unit 102T of FIG. 2. In a similar manner the imaginary cascade output of a corresponding filter unit 102B of a preceding filter section, designated F, can be forwarded to the sumin input of the filter unit 102B of FIG. 2.

There are two alternative ways of handling the sumin input sample value forwarded to an input-weighted filter unit 102T or 102B. A first way, not shown in FIG. 2, is to handle the sumin value in the same manner as such sample values are handled internally within an input-weighted filter unit 102T or 102B of any filter section. More specifically, each of the multiplexed first and second multiplier-accumulator registers associated with each tap of filter unit 102T or 102B multiplies the current input sample value by a coefficient value associated therewith, then adds this product value to the accumulated sum value from the corresponding multiplexed register forwarded thereto from the preceding tap after a delay of a specified number of Clk periods. In this first way, The sumin input E or F to a filter unit of a given filter section from the multiplexed output EE or FF of a corresponding filter unit of a preceding filter section is directly forwarded to the given filter section in multiplexed form. In this case, the first and second Clk period sample values of this sumin input is respectively added to the sum value of the first multiplier-accumulator register and to the sum value of the second multiplier-accumulator register associated with the first tap of the filter unit of the given filter section. In the second way, shown in FIG. 2, the multiplexed outputs EE and FF are demultiplexed before being forwarded to the E and F sumin filter-unit inputs of a following filter section. This is accomplished by delaying The EE and FF outputs by a Clk period in registers 202T and 202B and then adding the delayed EE and FF outputs to the undelayed EE and FF outputs in summers 204T and 204B. In this second way, the Real Out output from summer 204T and the Imag Out output from summer 204B (designated Out in FIG. 2a) is forwarded only during a selected valid one of the first and second Clk periods of each sample period SP (designated V portions of Out in FIG. 2a), and is not forwarded during the unselected bogus one of the first and second Clk periods of each sample period SP (designated X portions of Out in FIG. 2a). The selected valid one of the first and second Clk periods of each sample period SP for summers 204T and 204B need not be the same as one another.

Figure 3A:
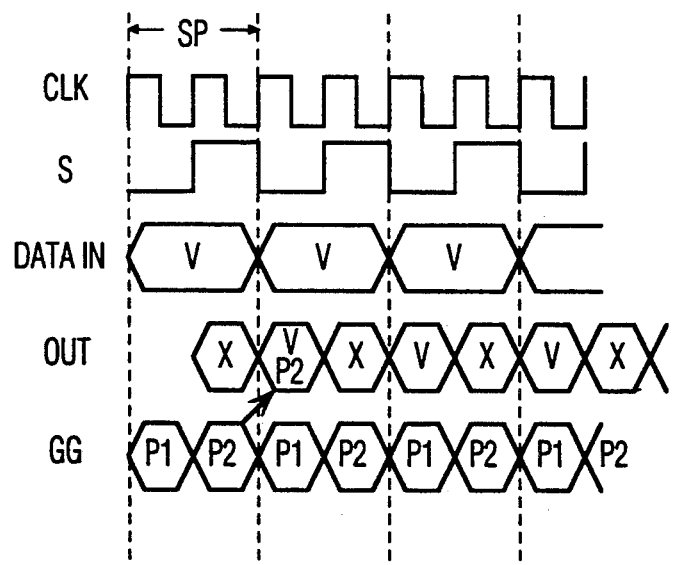
FIG. 3a is a timing diagram indicative of the operation thereof.

Reference is now made to FIG. 3, which shows the same top real-coefficient FIR filter unit 102T and bottom real-coefficient FIR filter unit 102B that are multiplex-operated as a single complex-coefficient input-weighted digital filter having a given number of taps in above-described FIG. 2, reconfigured to multiplex-operate as two independent real-coefficient input-weighted digital filters having twice this given number of taps. FIG. 3a is a timing diagram indicative of the operation of the FIG. 3 structure.

Figure 3B:
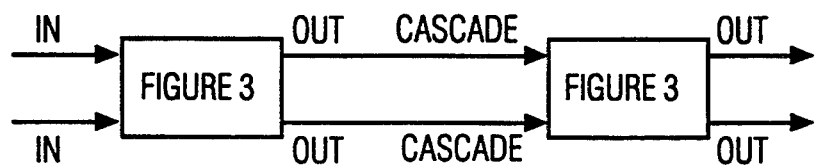
FIG. 3b diagrammatically illustrates the cascading of two of the n filter sections of FIG. 1 in which each of the two cascaded filter sections has the configuration of FIG. 3.

FIG. 3 shows top filter unit 102T associated with input multiplexer 300T and bottom real-coefficient FIR filter unit 102B associated with input multiplexer 300B. As shown in FIG. 2 and indicated in FIG. 2a, multiplexers 300T and 300B, each of which operates in a manner intrinsically similar to that described above in connection with multiplexer 200, respectively feed back the Out output of filter units 102T and 102B to the sumin input thereof during the first Clk period of each sample period SP, and respectively forward the cascade output of a corresponding filter unit of a preceding filter section, shown in FIG. 3b, to the sumin input of filter units 102T and 102B during the second Clk period of each sample period SP. Each of the filter units 102T and 102B of FIG. 3, which derives a GG output, operates as an input-weighted filter having its given number of real coefficients during a first pass therethrough of each of successive input samples that takes place during the first Clk periods of the successive sample periods SP (which successive samples of the GG output during the first Clk periods are designated P1 in FIG. 3a). Each of these successive samples P1 of the GG output of respective filter units 102T and 102B, after being delayed by a Clk period by respective registers 302T and 302B, is fed back for a second pass through filter units 102T and 102B that takes place during the second Clk periods of the successive sample periods SP (which successive samples of the GG output during the second Clk periods are designated P2 in FIG. 3a). Filter units 102T and 102B of FIG. 3, during the second pass, again operate as an input-weighted filter having its given number of real coefficients during the second pass therethrough of each of the successive delayed P1 samples. Therefore, with respect to the successive input samples, each of respective filter units 102T and 102B operates as an input-weighted filter having twice the given number of real coefficients to derive the successive P2 samples. The successive delayed P2 samples at the Out output of each of respective filter units 102T and 102B occurring during the first Clk periods of successive sample periods constitutes the valid V output and those occurring during the first Clk periods of successive sample periods constitutes the bogus X output, as indicated in FIG. 3a.

It is obvious that multiplex techniques similar to those employed in the FIG. 3 configuration could, without using feedback, configure filter units 102T and 102B to operate as up to four independent real FIR filters each with its own given number of real coefficients. Alternatively, using feedback, filter units 102T and 102B can be configured to forward the output samples of one of these two filter units as a cascade input to the other of these two filter units, thereby operating them as a single real FIR filter with four times the given number of real coefficients of each of them.

Examples of Reconfigurable Programmable Filter Chip Architecture:

The filter clock employed by the designed VLSI chip embodying the reconfigurable programmable digital filter architecture of the present invention is 28.636 MHz and the input data sample clock is 14.318 MHZ (i.e., one half the rate of the filter clock). The programming of the filter is determined by a software-controlled CPU. As stated in the above "overview", the designed VLSI chip comprises six sections comprising a single IIR input and global section and five filter sections, all of which filter sections have identical architectures. Because of the large amount of structure included in each of these sections, it is necessary in FIGS. 4a, 4b and 5 to 12 to abbreviate the designations of each structural item and to limit the illustrative examples of reconfigurable filter chip architecture shown in in FIGS. 4a, 4b and 5 to 12 to only three filter sections in order to fit all this structure within available drawing area. Nomenclature for this VLSI chip is derived from its use in a complex mode. Real filter sections and associated hardware relate to filter sections 102T and associated hardware in the description, while imaginary filter sections relate to filter sections 102B. The following is a list of the abbreviated designations employed in FIGS. 4a, 4b and 5 to 12:

1. Filter-section abbreviated designations:
   FIR Filter—Multiplexed FIR filter units similar to those shown in FIGS. 2 and 3. These input-weighted filters contain inter-tap programmable delays of from 1 to 4 sample periods, and they include multiplexed coefficients. "Input" connects to the coefficient multipliers, "sumin" adds in to the product of the first coefficient multiplier, and "sumout" is the output of the last adder, delayed by a clock period equal to one half a sample period.
   RB[4 ... 1], IB[4 ... 1]—Real and Imaginary Input Multiplexer Control. There are four inputs to each input multiplexer. There are four control bits to each multiplexer. On each of the first and second clock periods T0 and T1 of a sample period, different data are presented to the control of the input multiplexer. This allows any input to be selected from the four input selections during T0, and any input to be selected during T1. This is an easy way to obtain the required flexibility to cascade devices and support all required modes of operation. Each input multiplexer control includes a first latch for storing two control bits written into it by a CPU control line which define the effective one of the four inputs during any clock period T0, and a second latch for storing two control bits written into it by the CPU control line which define the effective one of the four inputs during any clock period T1.

RIReg, IIReg—Real and Imaginary Input Data Registers. This is a pipeline delay, as well as a buffer for data into the filter inputs. This is programmable to sample at clock rate for complex modes, and at sample rate for real mode.

RM1, IM1—Real and Imaginary Real/complex mode multiplexers. Real mode is set to input 0, Complex mode is set to input 1.

RM2, IM2—Real and Imaginary Output Multiplexers for selecting the data output source from the following 4 options:

| Option | Real Mode Function | Complex Mode Function |
|---|---|---|
| 0 | Inter Section delay 2 | Inter Section delay 2 |
| 1 | Not Useful | Inter Section delay 1 |
| 2 | Inter Section delay 3-155 | Inter Section delay 3-155 |
| 3 | Inter Section delay 1 | Not Useful |

ROReg, IOReg—Real and Imaginary Output Data Registers.

T0—First clock period of a sample period.

T1—Second clock period of a sample period.

T1ena—Enable in T1. This is a register operating at sample rate, enabled only during the T1 clock periods. Data will transition only on the sample period transitions. The bulk delay operates at sample period rate, not clock period rate. This forms the third delay added to the bulk delay range of 0 to 152 to get the range from 3 to 155.

$z^{-1}$—Delay of clock period where it stands alone in FIGS. 4a, 4b and 5 to 12. Otherwise, it is adjustable to be either one clock period for complex, one full sample period for real (R1Reg, I1Rcg), or one full sample period always (T1ena), or one full sample period enabled in T1 for real, T0 for complex (ROReg, IOReg). Its only consistent definition is that it is implemented with only a single register stage.

$z^{-3kr}$, $z^{-3ki}$—Real and Imaginary programmable inter-tap delay. Used Only in real mode configurations. Range from 0 to 3 sample period delays.

$z^{-RDEL}$, $z^{-IDEL}$—Real and Imaginary Bulk Delay Registers. Programmable from 0 to 152 sample period delays.

2. IIR input and global section abbreviated designations:

ISC, QSC—In-phase Scaling Control and Quadrature Scaling Control. This multiplexer allows shifting of IIR feedback data to get additional precision when all IIR coefficients are less than 1, ½, or ⅛. In FIR only mode, it is convenient to select a 0 as input. This multiplexer is statically controlled and resembles a switch.

M2—Quadrature (Imaginary) cascade source select. In conjunction with M5, any filter section or IIR adder output or zero can be cascaded to the sumin input of the input filter section of the chip (filter section n in FIG. 1 and filter section 3 in FIGS. 4a, 4b and 5 to 12). Like RB and IB, this multiplexer can alternately select different inputs on each clock period cycle. This is required for some complex mode configuration cascades.

M3—In-phase (Real) cascade source select. In conjunction with M4, any filter section or IIR adder output or zero can be cascaded to the sumin input of the input filter section of the chip (filter section n in FIG. 1 and filter section 3 in FIGS. 4a, 4b and 5 to 12). Like RB and IB, this multiplexer can alternately select any input clock period cycle. This is required for some complex mode cascades.

M4—In-phase (Real) section select. Selects the output of any real (In-phase) half filter section or the real IIR adder output to drive M3.

M5—Quadrature (Imaginary) section select. Selects the output of any imaginary (quadrature) half filter section or the imaginary IIR adder output to drive M2.

M6—In-phase (Real) output select. Selects the output of any real half filter section or the real IIR adder output to be output from the Iout terminals.

M7—Quadrature (Imaginary) output select. Selects the output of any imaginary half filter section or the imaginary IIR adder output to be output from the Qout terminals.

M8—FIR Input Multiplexer. In FIR modes, input data comes from either the IIR filter output or the phase rotator output. Either way, it is routed through the IIR filter adder—the other IIR addend is set to 0 by ISC and QSC if the filter is pure FIR. In real mode, either adder can be used as a data source. In complex modes, M8 multiplexes real and imaginary data at the clock period rate which is twice the sample period rate, thereby formatting the input data for the multiplexed filter sections.

T0ena $z^{-1}$—A register enabled in the T0 clock period of a sample period.

3. Chip system input and output abbreviated designations:

0—The constant value of zero.

I1, I2, I3—Outputs of In-phase (real) filter sections 1, 2, 3.

Iout—In-phase filter output.

Iph—In-phase input to IIR adder, from phase rotator. Used as real input in real mode.

Isumin—In-phase Cascade Input. Used as real only cascade input in real mode configuration.

MIO—Multiplexed Filter I/O—Real/Imaginary multiplexed signal in complex mode, real signal in real mode. This is an output on the chip with the active IIR feedback adder. It is input on all other chips. MIOena enables the output capability.

MIOena—Enables the output capability of the MIO bus.

Q1, Q2, Q3—Outputs of Quadrature filter sections 1, 2, 3.

Qout—Quadrature Filter output.

Qph—Quadrature input to IIR adder, from phase rotator.

Qsumin—Quadrature Phase Cascade Input.

The identical chip architecture of the three filter sections and the single IIR input and global section shown in each of FIGS. 4a, 4b and 5 to 12 is selectively programmed to be reconfigured into a particular one of nine different filter configurations or, alternatively, to merely forward the cascade input to the chip with a certain amount of delay to the cascade output of the chip without any filtering taking place. A software-controlled CPU accomplishes this selective programming solely by (1) determining the input-output connection of each input multiplexer of each filter section during respective clock periods T0 and T1 of each sample period; (2) determining the input-output connection of each routing multiplexer RM1, IM1, RM2 and IM2 of each filter section; (3) determining the input-output connection of each routing multiplexer ISC, QSC, M2, M3, M4, M5, M6, M7 and M8 of the single IIR input and global section; and (4) controlling the respective digital values of the in-phase (real) Iph portion and the quadrature-phase (imaginary) Qph portion of a complex phase-rotating coefficient.

Figure 4A:
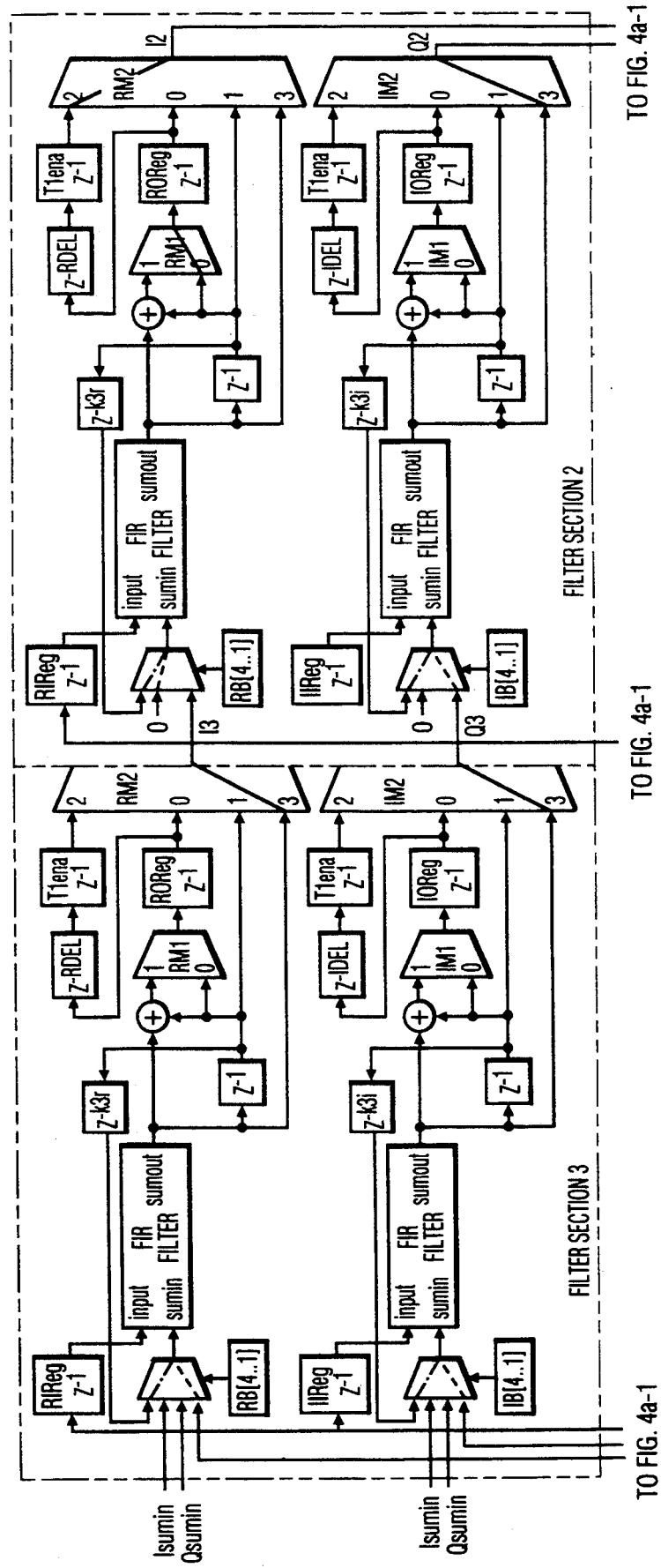
FIGS. 4a, 4b and 5 to 12 diagrammatically show in detail illustrative examples of various types of filters suitable for use as deghosting and/or equalization filters, each of which may be implemented on a VLSI chip by a different programmable configuration of a single global section and three identically-structured filter sections.
Figures 1, 4A:
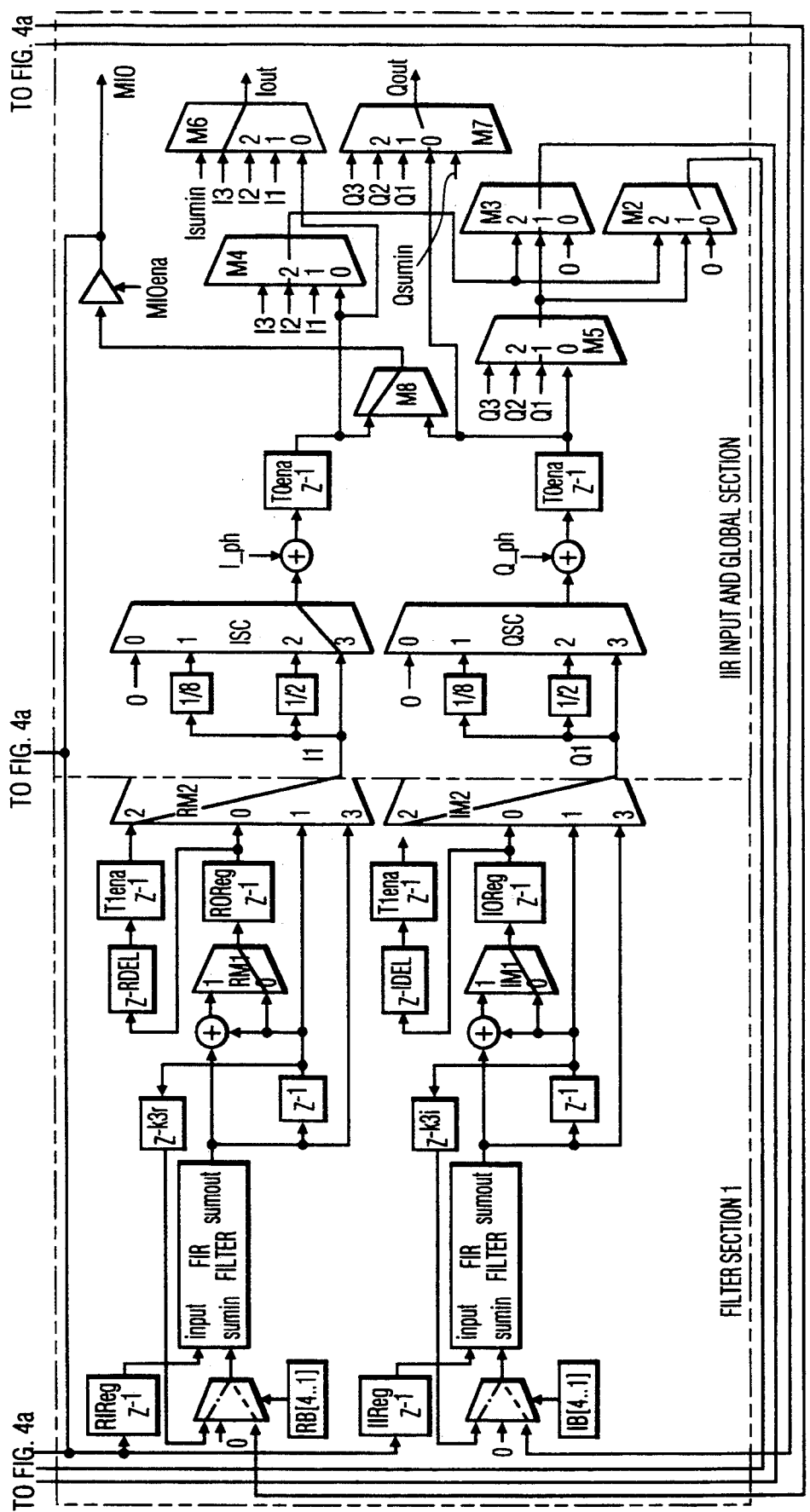

As known, NTSC television signals are real signals, not complex signals. In this case, the three filter sections and the single IIR input and global section should be configured into a real (not complex) filter. The chip architecture configuration shown in FIG. 4a is an example of a real IIR filter followed by a real FIR filter for the case in which the IIR filter uses fewer filter sections than the FIR filter. In FIG. 4a, the FIR is constructed from all imaginary sections and the real half of section 3. Further, input data is fed into the real side of the IIR input adder by providing a complex phase-rotating coefficient value $1-2^{-10}+j0$ (where $1-2^{-10}$ is the closest value to 1 that can be expressed in $\pm$binary form with 11 significant digits). The IIR output is fed back by the MIO bus, and the first section of the FIR filter is implemented by the imaginary (bottom) half of filter section 3. The output of the imaginary half of filter section 1 is fed back to the real sumin (top) of filter section 3. The FIR filter output is taken from the real output of filter section 3.

Figure 4B:
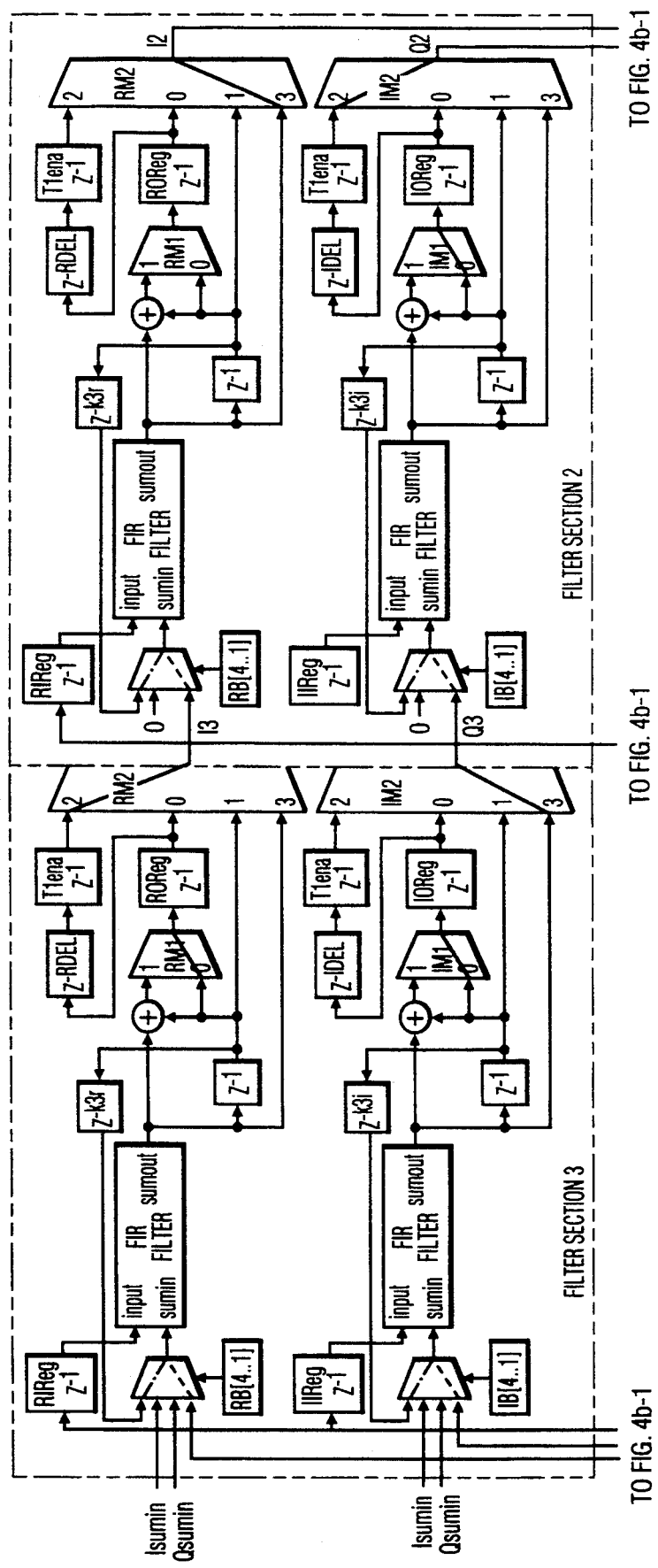
Figures 1, 4B:
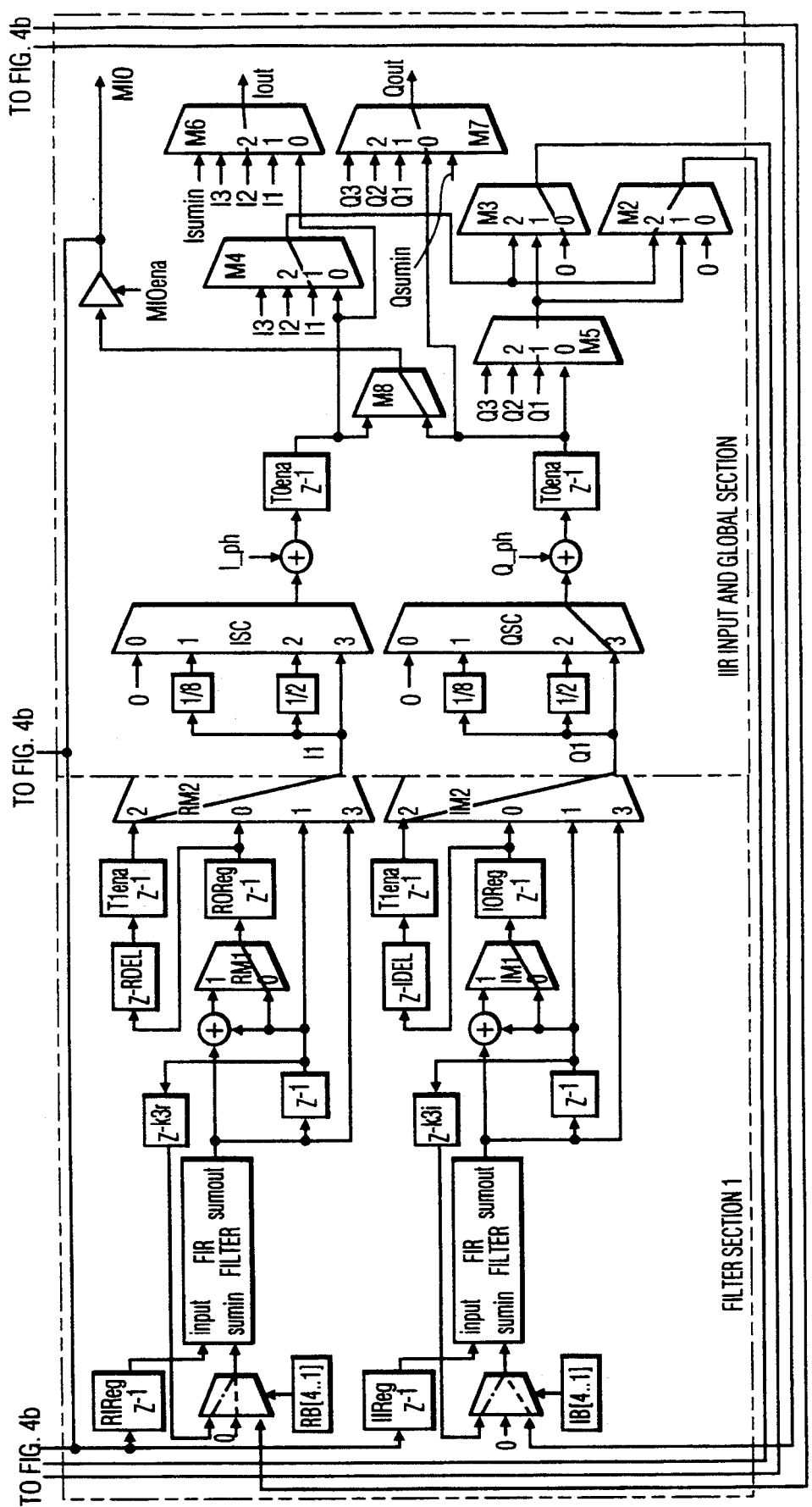

The chip architecture configuration shown in FIG. 4b is an example of a real IIR filter followed by a real FIR filter for the case in which the IIR filter uses more filter sections than the FIR filter. FIG. 4b defines a real IIR filter using the imaginary half of all filter sections and the real half of filter section 1. The FIR filter is composed of the real half of filter sections 1 and 2. The real input data is fed to the imaginary side of the IIR input adder by providing a complex phase-rotating coefficient value $0+j(1-2^{-10})$. As always, the IIR output is fed back by the MIO bus.

FIGS. 5-12 show other examples of configurations that are useful as deghosting and/or equalization filters for HDTV television currently being developed and/or NTSC television. These filters include real filters, complex filters and combinations thereof.

Figure 5B:
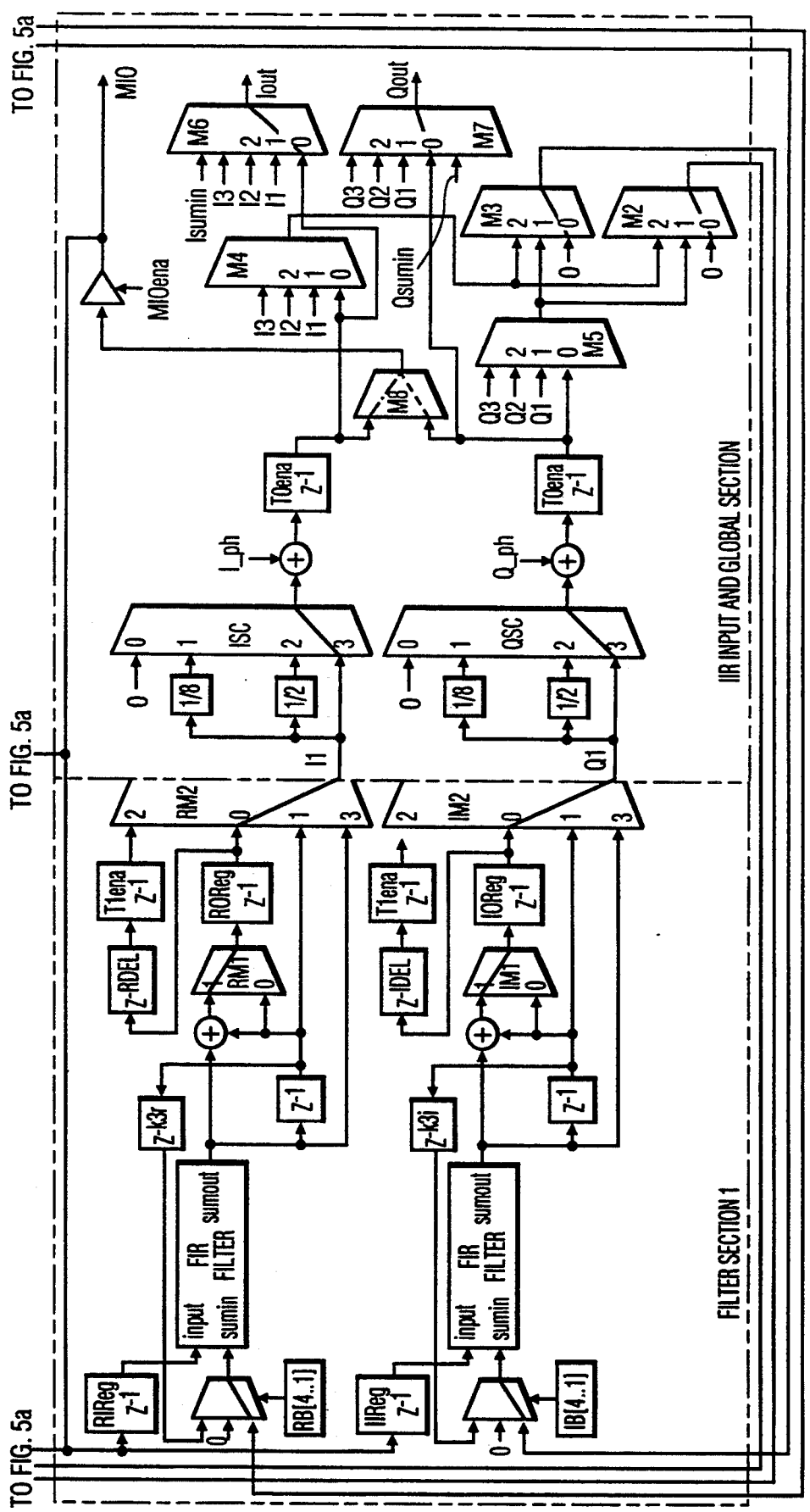

FIG. 5 shows an example of a complex IIR filter configuration. In this configuration, the entire chip is programmed as a complex IIR filter. Sections 1 and 2 are shown with only a $z^{-1}$ delay and section 3 is separated from section 2 by the bulk delay. The Isumin and Qsumin terminals are not used, except possibly for cascading; input data arrives on I and Q input terminals of the VLSI chip (not shown), and the filter output is derived on Iout and Qout. RIReg and IIReg are all configured for clocking during both the T0 and T1 clock periods, and ROReg and IOReg are configured for clocking only at the end of a T0 clock period.

Figure 6A:
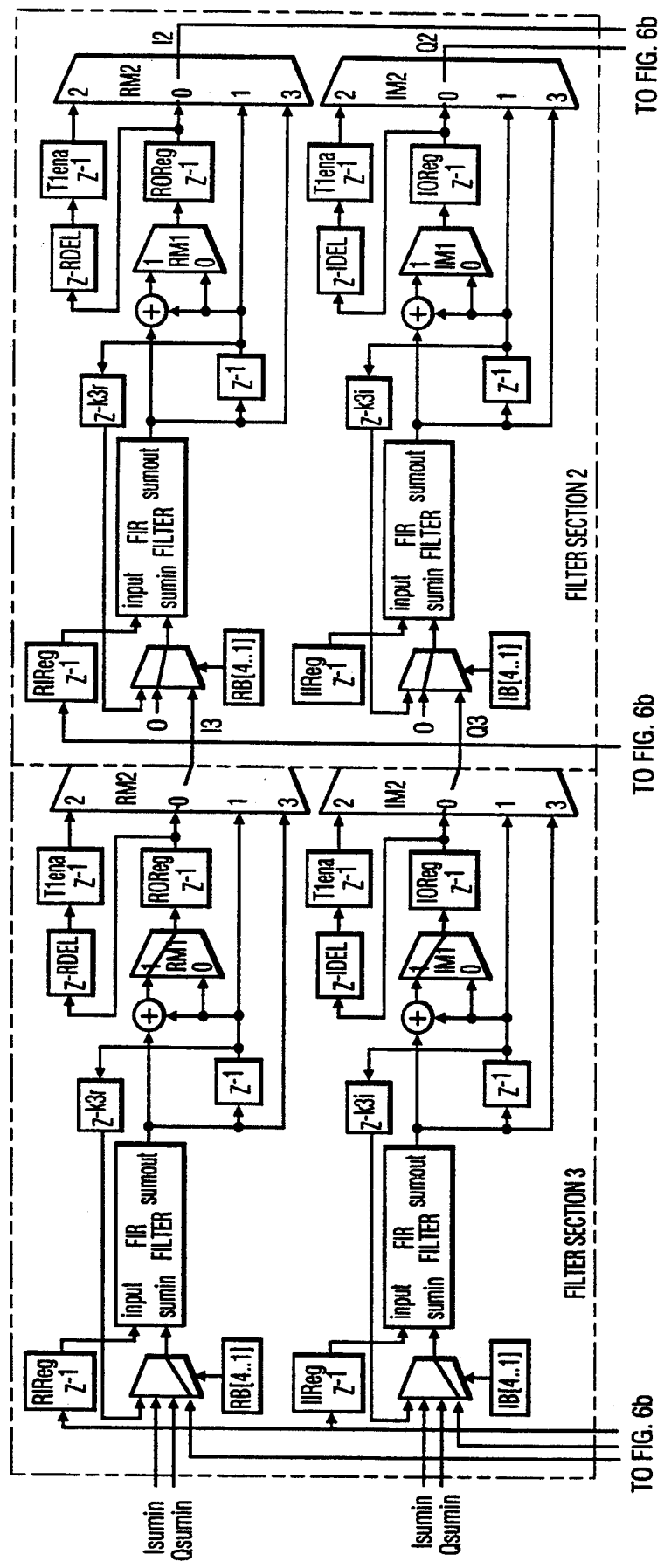
Figure 6B:
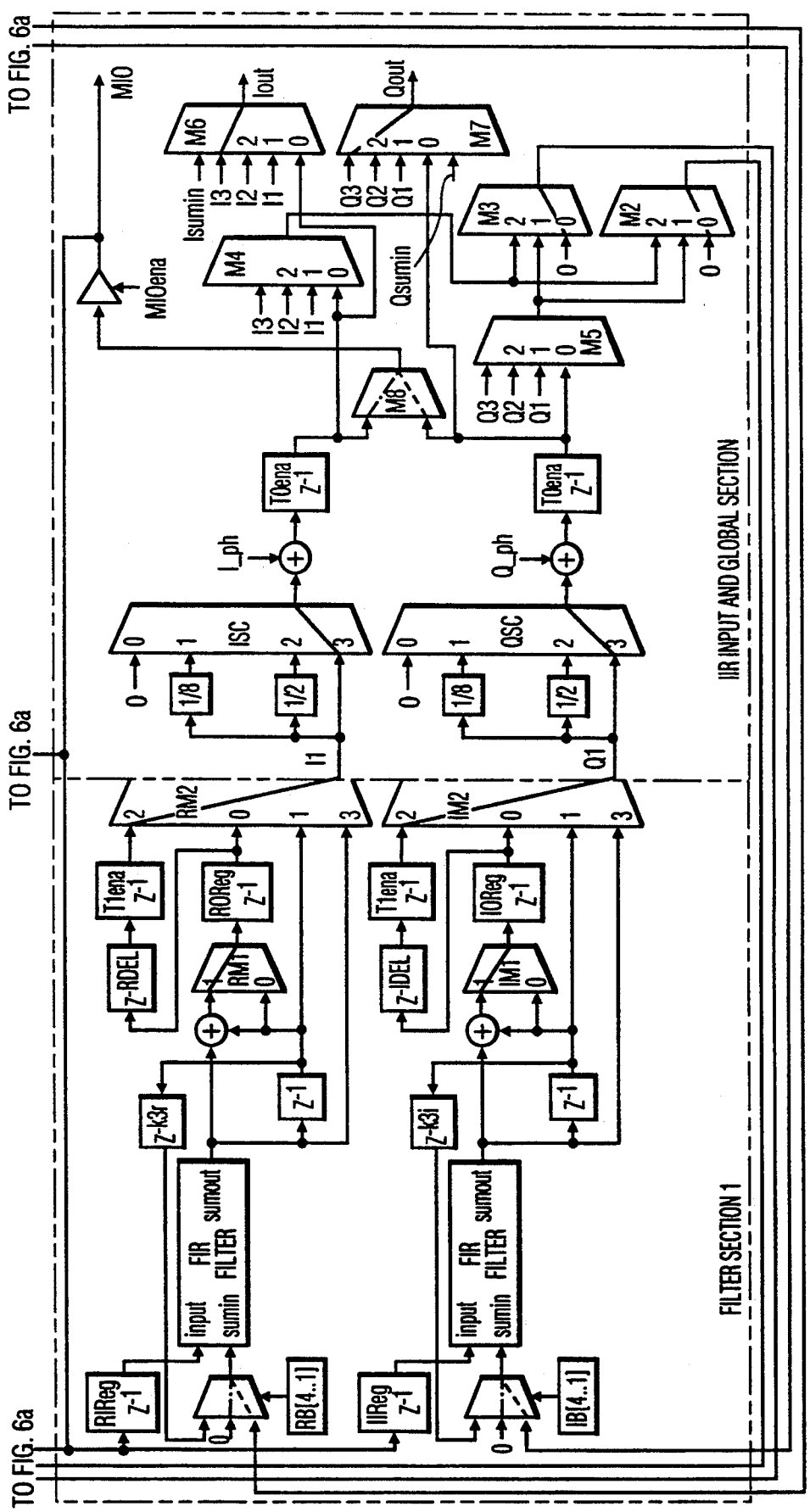

FIG. 6 shows an example of a configuration comprising a complex IIR filter with a complex FIR filter on one chip. In this configuration, filter sections 1 and 2 are in IIR filter mode, while section 3 is configured as a 3 tap FIR. Phase adjusted input data arrives on Iph and Qph, and output data is derived on Iout and Qout, which receives their output from filter section 3. RIReg and IIReg are all configured for clocking during both T0 and T1 clock periods, and ROReg and IOReg are configured for clocking only at the end of T0 clock periods. Filter section 2 is separated from filter section 1 by a $z^{-1}$ delay of one sample period (i.e. e clock periods), while filter section 1 uses the bulk delay to get a total delay of 3 to 155 sample periods before being added to the input data. Note that a delay is incurred in recovering the complex output data of section 3. If section 3 were to cascade to the next chip, the complex components (i.e., the four coefficient/data products RR, -II, RI, and IR) could be passed over the output busses. Since this example is a stand alone configuration, the real and imaginary filter outputs are computed before the output. This delay is simply signal latency.

Figure 7A:
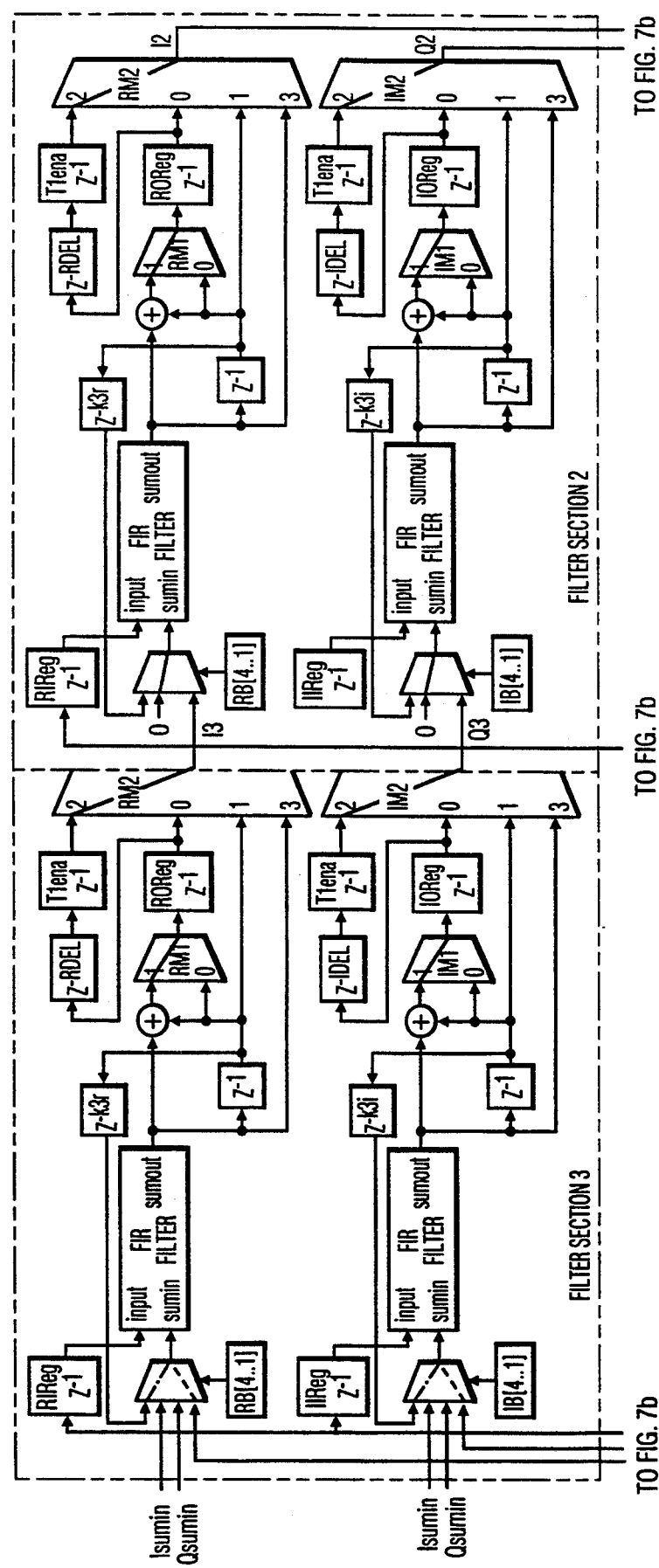
Figure 7B:
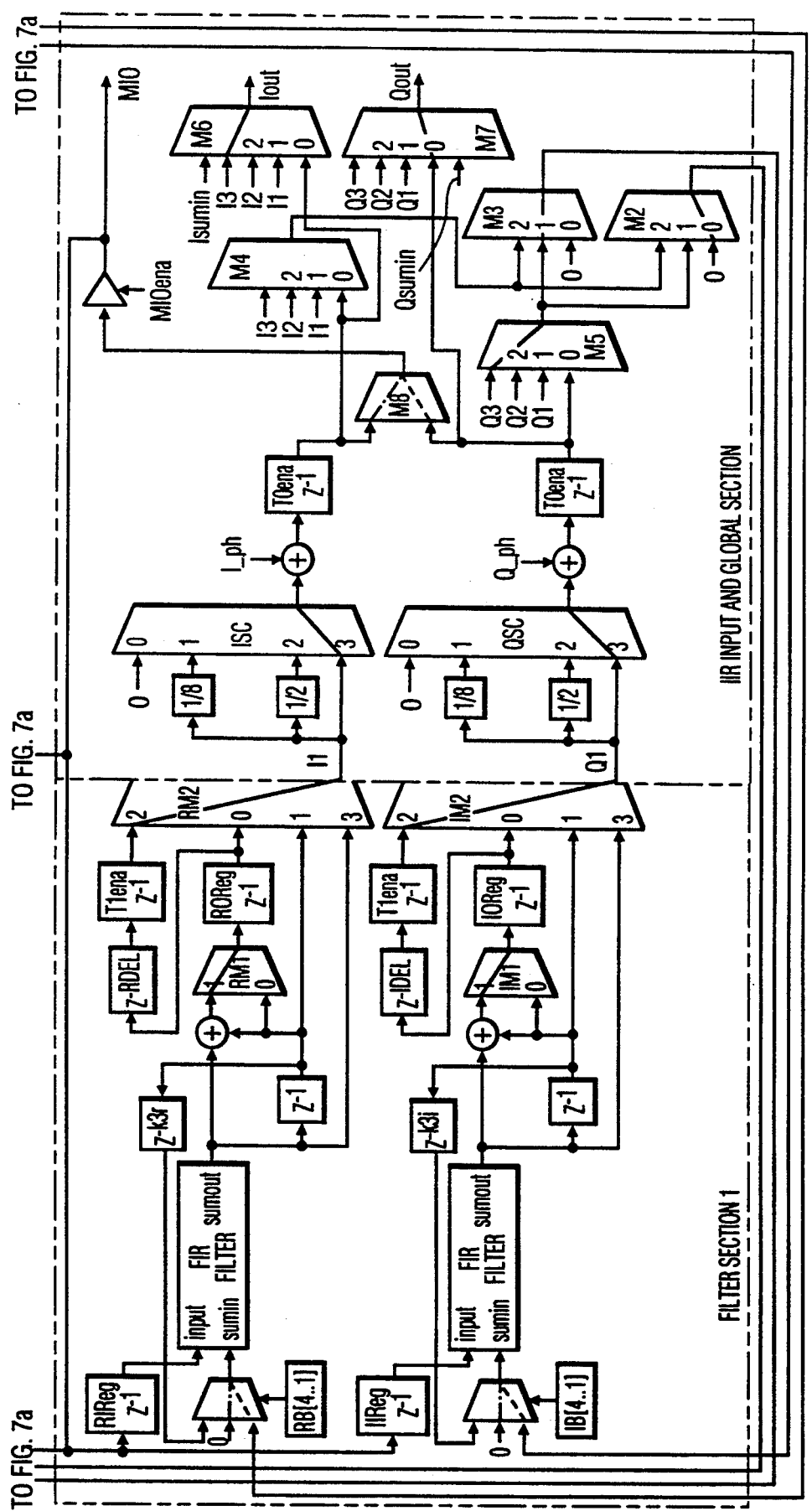

FIG. 7 shows an example of a configuration comprising a complex IIR filter followed by a real FIR filter processing the real part of a complex IIR output. In this configuration, filter sections 1 and 2 compute complex IIR, filter section 3 computes a 12 tap real FIR. The bulk delay RDEL from section 3 can be used to separate the two six tap sections of real FIR in time. To capture only the real output data from the real filter, one must use the bulk delay path to the output terminals. If cascading, the input section would zero the intermediate tap information. RIReg and IIReg of section 3 are enabled only in the T1 clock period for real only operation. ROReg and IOReg of section 3 are always enabled for real only operation. RIReg and IIReg of sections 1 and 2 are always enabled, while ROReg and IOReg in sections 1 and 2 are enabled only in T0. The imaginary output of the complex IIR filter is available on the multiplexed output bus MIO and on the Qout terminals of the chip.

Figure 8B:
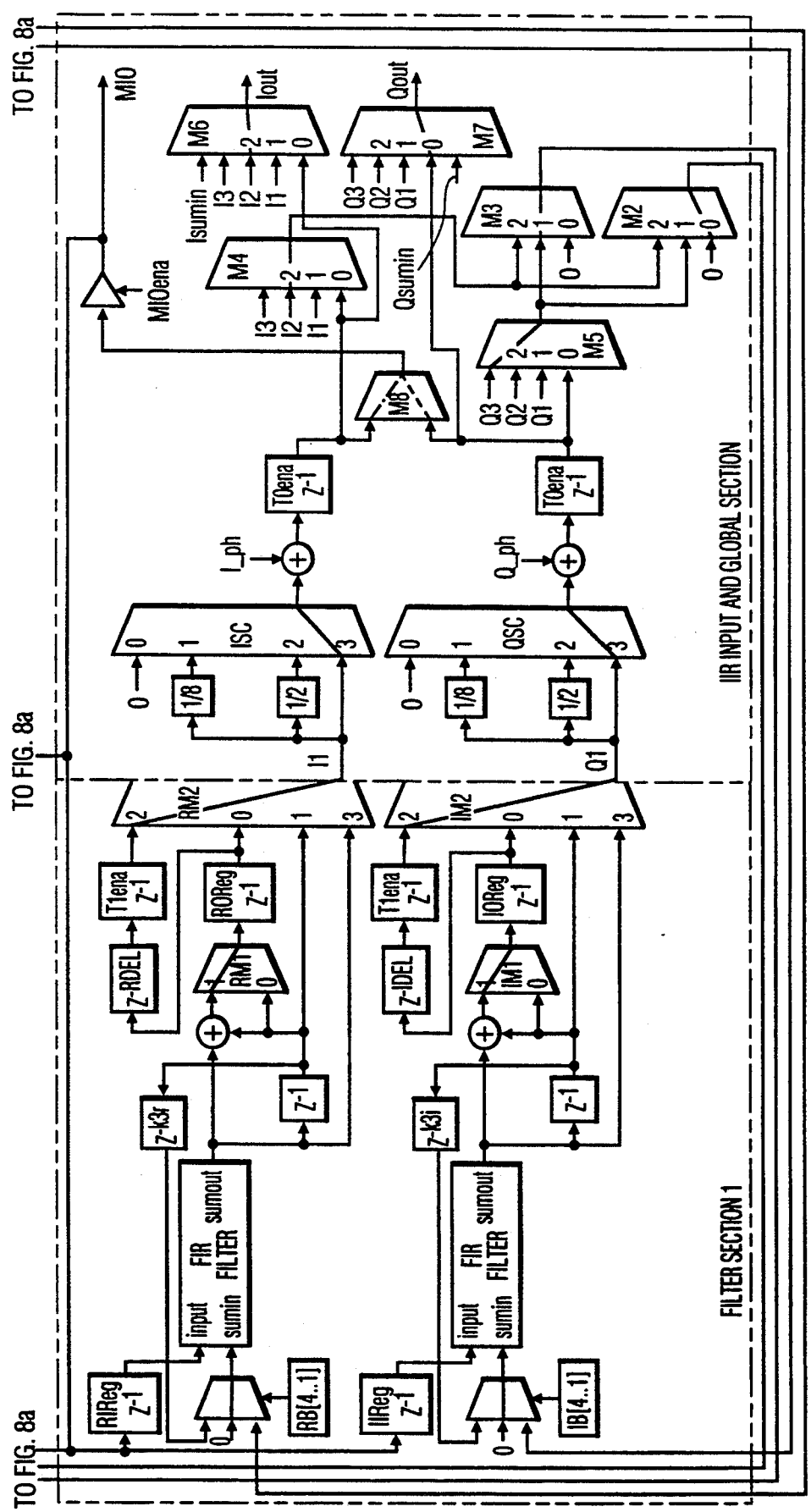

FIG. 8 shows an example of a configuration comprising a complex IIR filter followed by a half complex FIR filter. In this configuration, filter section 1 computes an IIR filter, filter sections 2 and 3 compute a 12 tap half complex FIR filter. The 12 tap FIR filter is configured as a 9 tap equalizer, with a 3 tap pre-ghost attenuator separated from the equalizer by the bulk delay IDEL in filter section 3. Real output is on Iout. Imaginary IIR output available in multiplexed MIO bus and Qout terminals. The FIR filter sections are cascaded. When bulk delay is required, the real data times real coefficients sum and imaginary data times imaginary coefficients sums must be subtracted, and the complete real result is stored in the bulk delay. Direct cascades require transfer of the partial sums of real data times real coefficients, and imaginary data times imaginary coefficients in a multiplexed form (real times real in T0 clock periods and imaginary times imaginary in T1 clock periods).

Figure 9A:
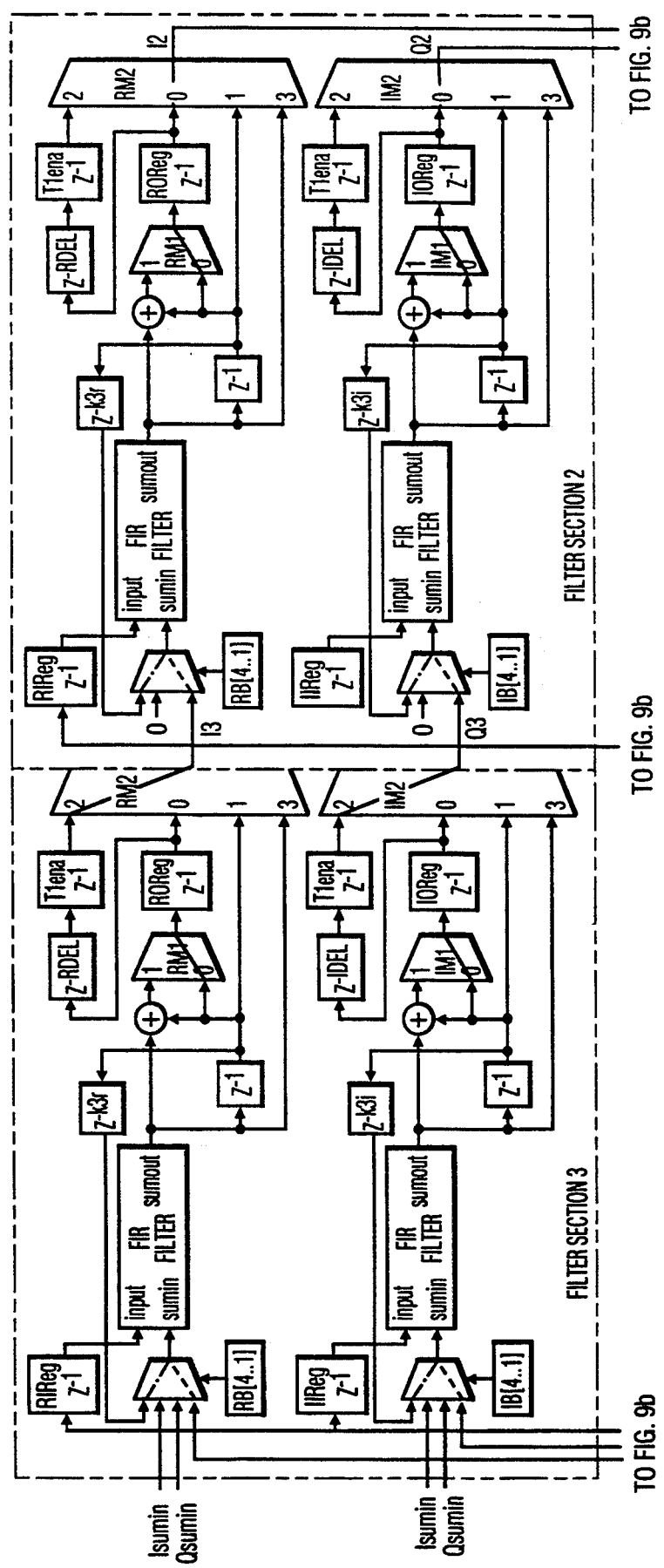
Figure 9B:
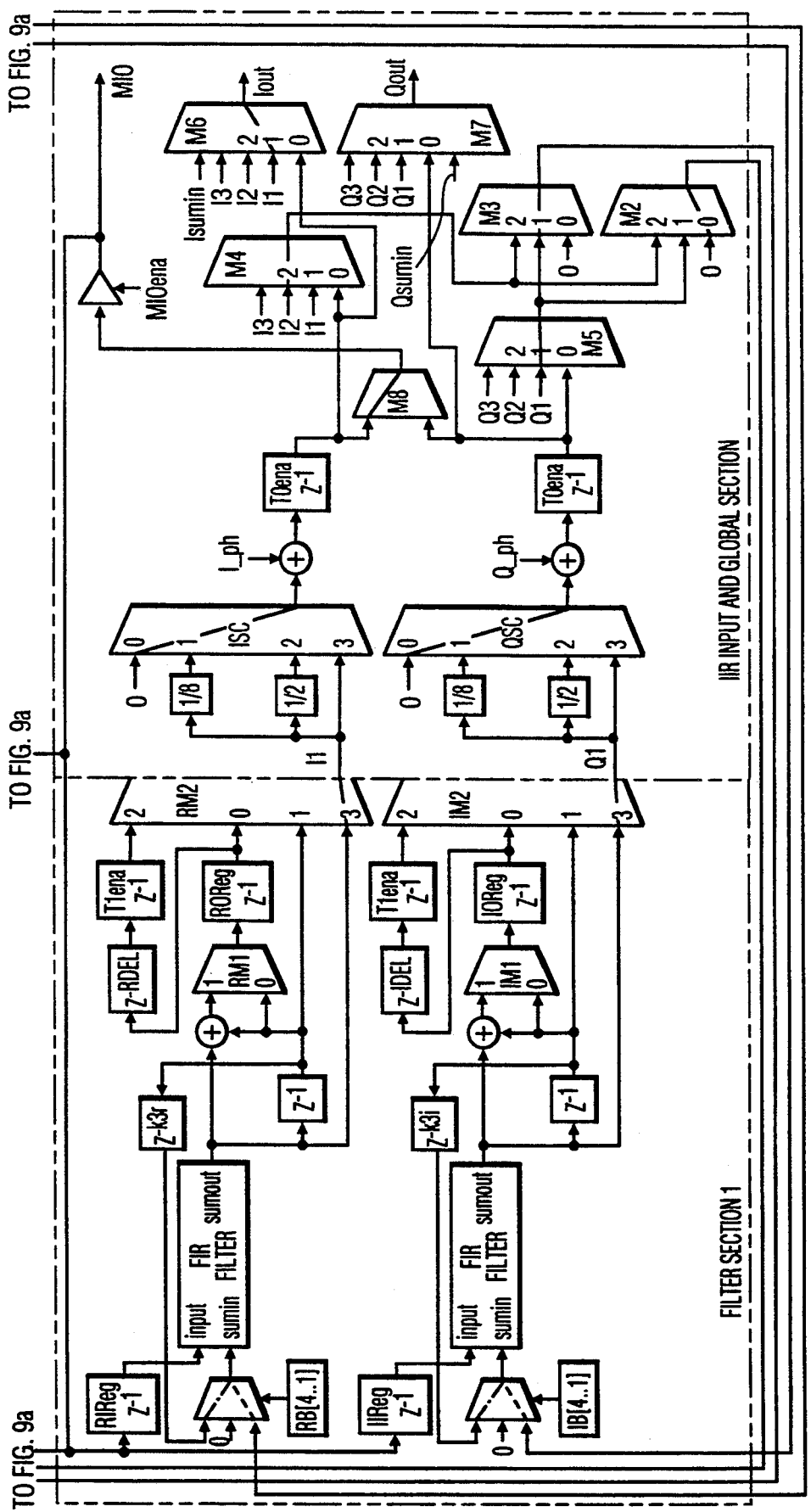

FIG. 9 shows an example of a configuration comprising a single real FIR filter. In this configuration, the input to Iph is routed to all filter inputs. The effective first filter section of this real FIR filter is the imaginary half of filter section 3. The imaginary half of filter section 1 is routed back to the real half of filter section 3, and the output is taken from the real half of filter section 1.

Figure 10A:
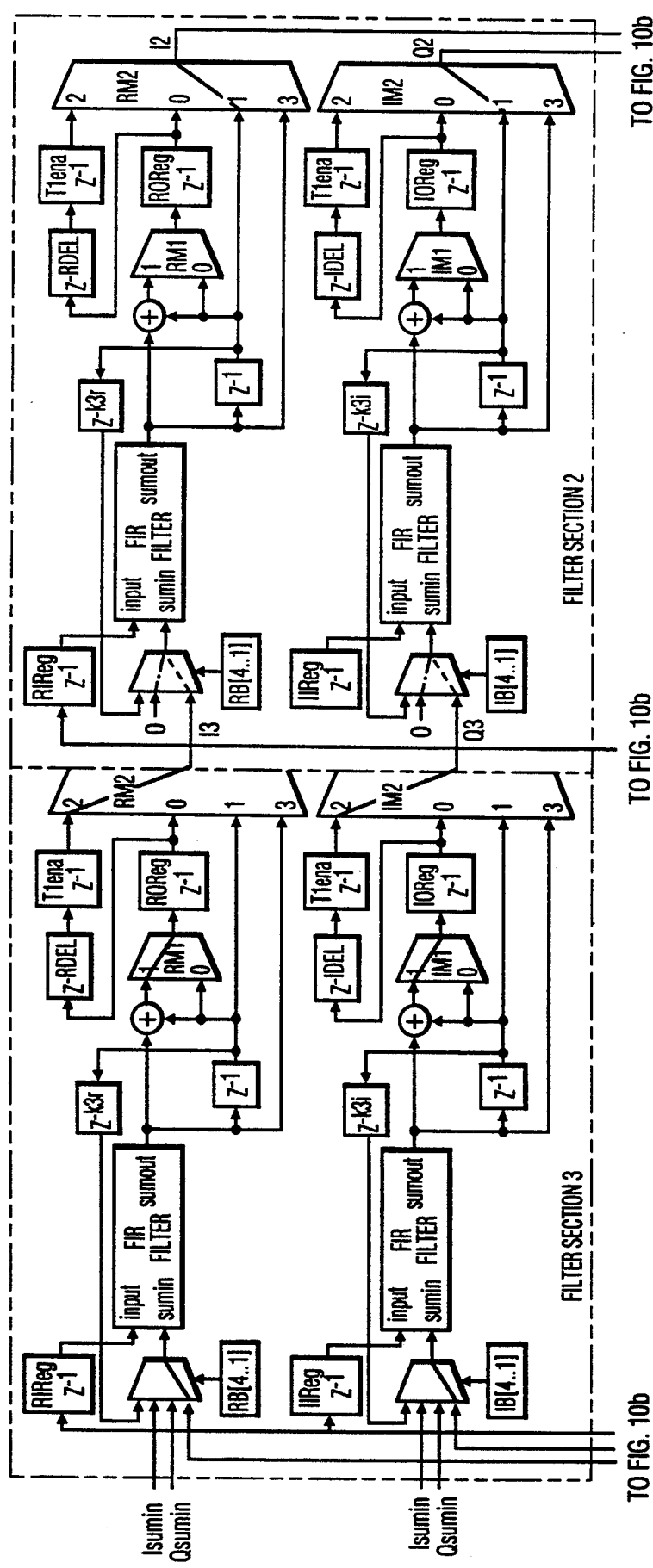
Figure 10B:
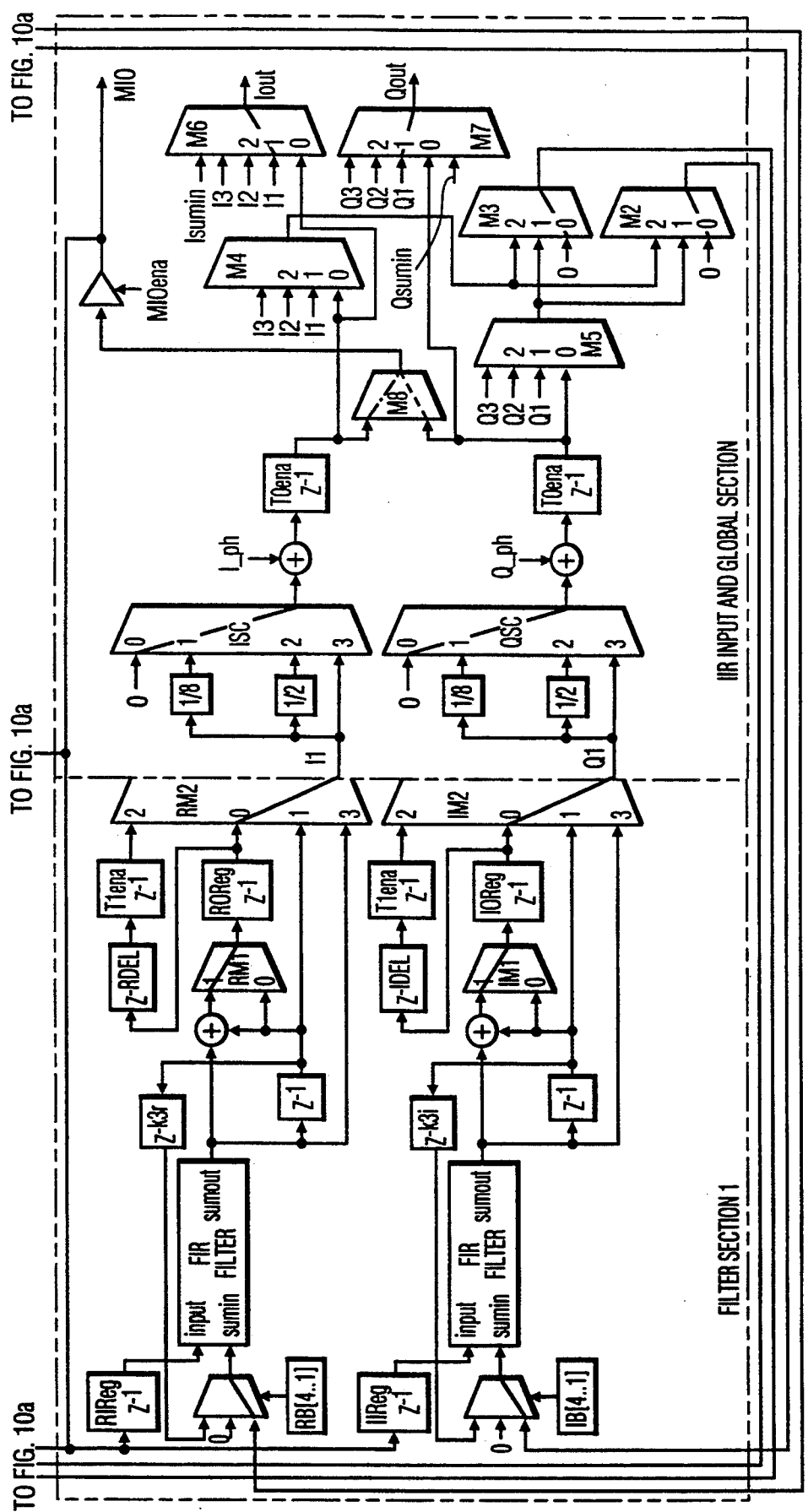

FIG. 10 shows an example of a configuration comprising a single complex FIR filter. In the light of the above teaching, this configuration is straight forward.

Figure 11A:
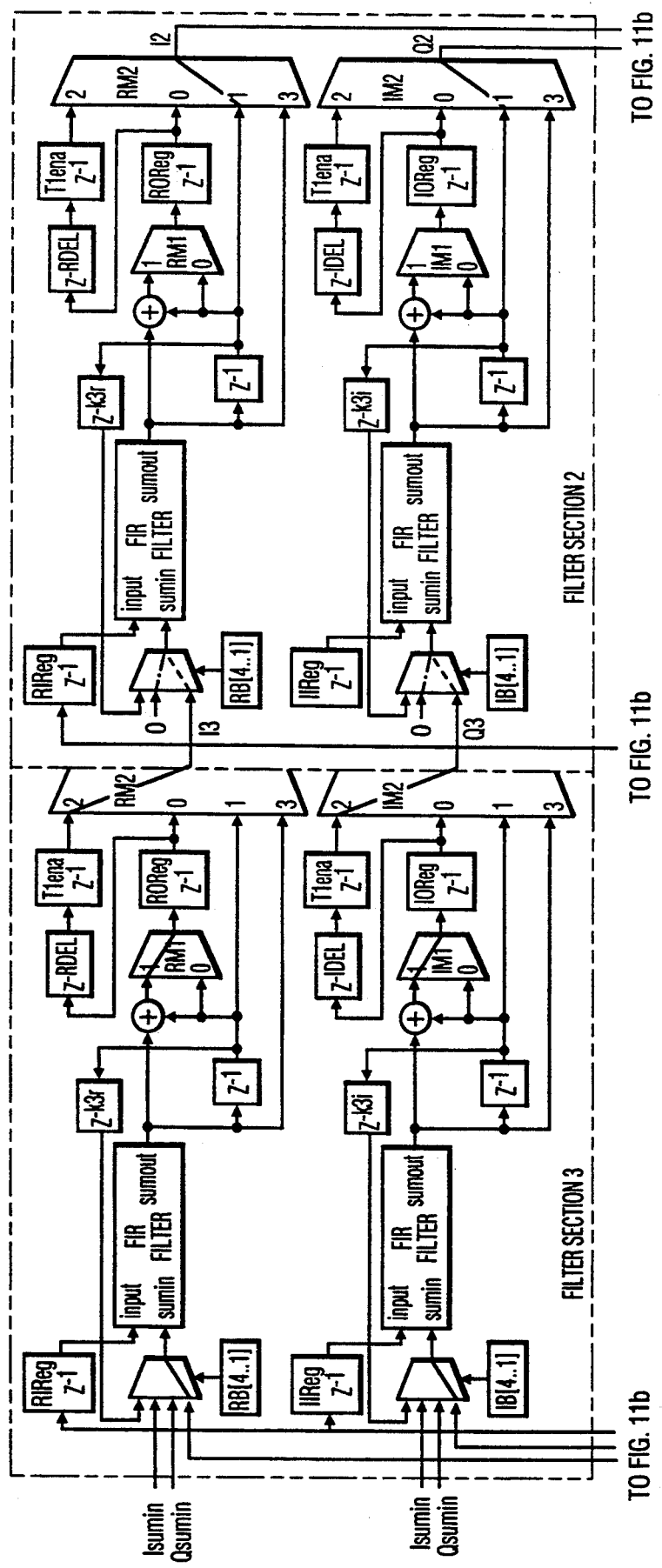
Figure 11B:
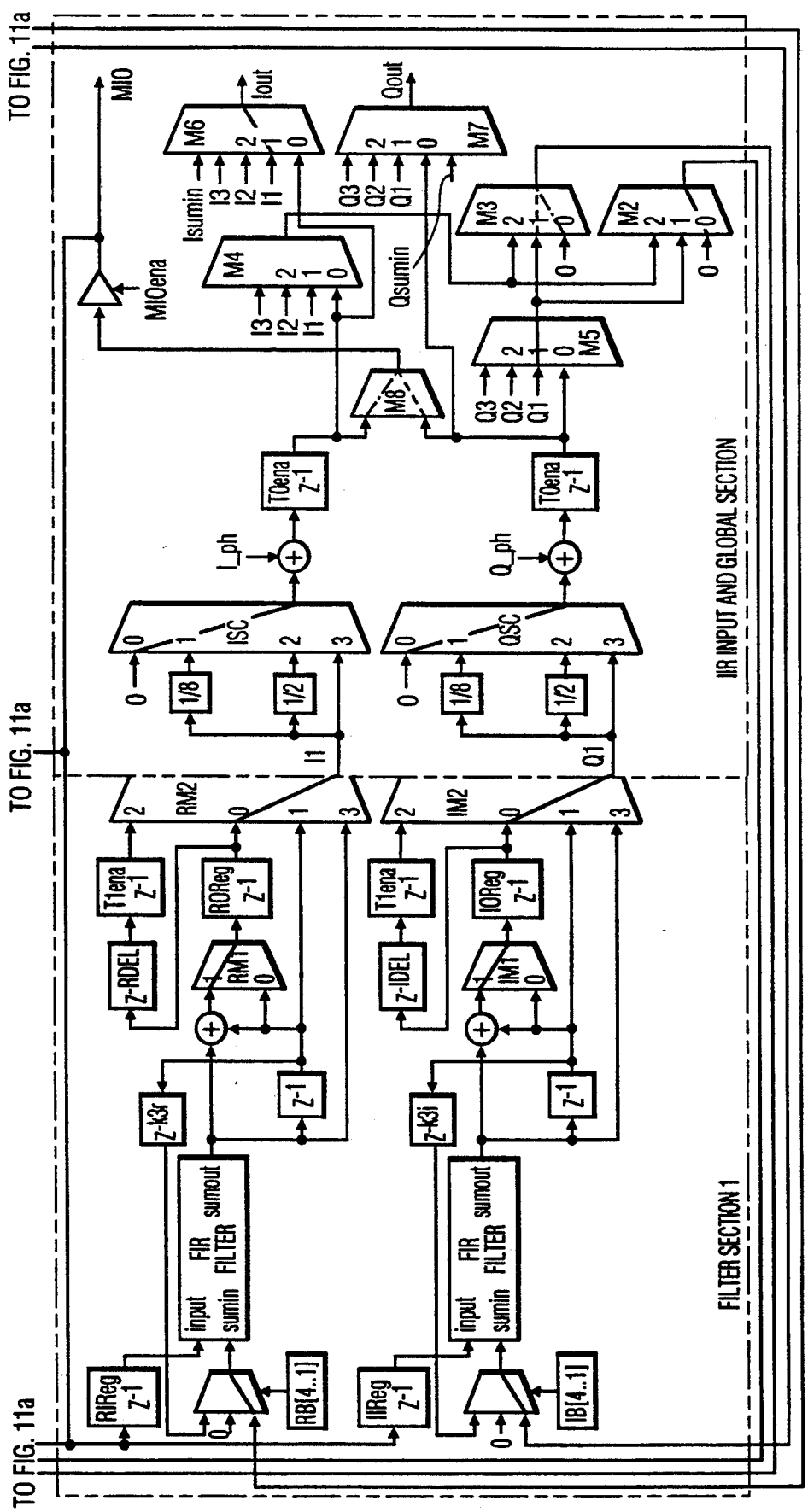

FIG. 11 shows an example of a configuration comprising a half complex FIR filter. In this configuration, complex data is input to Iph and Qph. It is multiplexed real/complex on T0 and T1 clock periods by M8 and fed to the inputs of all filter sections 1, 2 and 3. The imaginary half of filter section 3 is the effective first FIR filter section, the output of the imaginary half of filter section 1 is fed back to the real half of filter section 3, and the real output is taken from the real half of filter section 1.

Figure 12B:
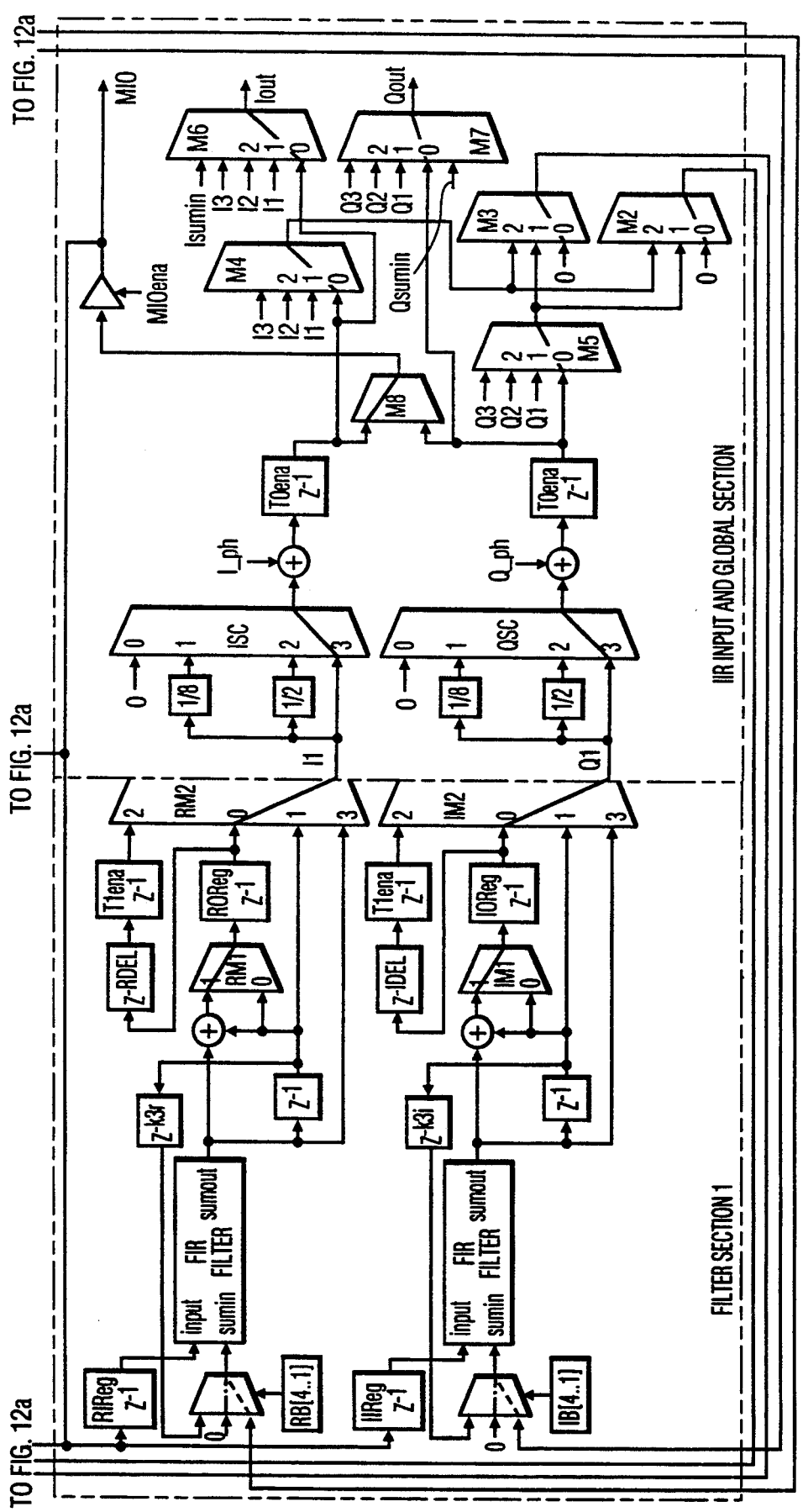

FIG. 12 shows an example of a configuration which conveys data unchanged by operating merely as a delay line between the chip inputs and outputs. This is the the default condition that occurs on power startup of the chip. The data passes through unchanged because the coefficients are all set to zero in response to a special control signal present on power startup, which is applied to multiplexers ISC and QSC to cause these multiplexers to forward 0 values to the IIR adders, while this special control signal also causes the value of the complex coefficient defined by Iph and Qph to be $1-2^{-10}+j0$, rather than being 0. The default operation passes data from input to sumout on the chip and cause data to ripple through the sumin of the FIR filters to the next sumout. Multiplexers labeled ISC and QSC are set to selection 0 if FIRSTL is active. The input phase rotator is set to $1-2^{-10}+j0$ if FIRSTL is active, otherwise the input phase rotator is set to $0+j0$. This allows pass through of data from the first IC to the last in the chain to verify the functionality of the system construction.

It is not intended that the particular illustrative examples shown in FIGS. 4a, 4b and 5 to 12 of the filter architecture of the present invention be in any way limiting. Many different or larger filter configurations of input-weighted multiplexed filter-unit pairs that form real FIR or IIR filters, complex FIR or IIR filters or filters which are various combinations thereof, can be implemented with the designed six-section VLSI chip, and even larger filter configurations can be implemented with a plurality of such chips connected in cascade.

What is claimed is:

1. In a reconfigurable programmable digital filter structure suitable for use as a deghosting filter; wherein said structure includes first and second input-weighted digital filter means each of which has a given number of multiplier-coefficient taps; a combination comprising:
   input means for providing input signals to said digital filter means;
   filter-reconfiguration means including multiplexer means coupled to said digital filter means (1) for configuring said first and second digital filter means for operation as a single complex digital filter means with said given number of complex multiplier coefficients for a complex sampled input signal provided thereto by said input means, or (2) for configuring at least one of said first and second digital filter units for operation as a separate real digital filter means with twice said given number of real multiplier coefficients for a real sampled input signal provided thereto by said input means; and
   output means for receiving output signals from said digital filter means.

2. The digital filter structure defined in claim 1, wherein:
   each of said given number of multiplier-coefficient taps of each of said first and second filter means has a first multiplier-accumulator register and a second multiplier-accumulator register associated therewith.

3. The digital filter structure defined in claim 2, wherein said filter-reconfiguration means including multiplexer means in configuration (1) comprises:
   means for (a) applying the value of the real component of each input sample as an input to said first filter means and applying the value of the real component of the multiplier coefficient of the first register associated with each tap of said first filter means to that first register during each first clock period of first and second time-multiplexed clock periods, (b) applying the value of the imaginary component of each input sample as an input to said second filter means and applying the value of the real component of the multiplier coefficient of the first register associated with each tap of said second filter means to that tap during each first clock period of said first and second time-multiplexed clock periods, (c) applying the value of the imaginary component of each input sample as an input to said first filter means and applying the negative of the value of the imaginary component of the multiplier coefficient of the second register associated with each tap of said first filter means to that tap during each second clock period of said first and second time-multiplexed clock periods, and (d) applying the value of the imaginary component of each input sample as an input to said second filter means and applying the value of the real component of the multiplier coefficient of the second register associated with each tap of said second filter means to that tap during each second clock period of said first and second time-multiplexed clock periods.

4. The digital filter structure defined in claim 3, wherein said means including filter reconfiguration multiplexer means further includes:
   first means responsive to respective outputs of said first filter means during each of said first and second clock periods for deriving, during a certain one of said first and second clock periods, an output sample from said first means having a value corresponding to the sum of said respective outputs of said first filter unit; and
   second means responsive to respective outputs of said second filter means during each of said first and second clock periods for deriving, during said certain one of said first and second clock periods, an output sample from said second means having a value corresponding to the sum of said respective outputs of said second filter means.

5. The digital filter structure defined in claim 2, wherein said filter-reconfiguration means including multiplexer means in configuration (2) comprises:
   first means for (a) applying the value of each real input sample associated with one of said first and second filter means as an input thereto during both of first and second time-multiplexed clock periods, (b) applying the value of each of a first group of said given number of real multiplier coefficients to a corresponding one of the first registers associated with the taps of said one filter means during each first clock period of said first and second time-multiplexed clock periods, and (c) applying the value of each of a second group of said given number of real multiplier coefficients to a corresponding one of the second registers associated with the taps of said one filter means during each second clock period of said first and second time-multiplexed clock periods; and
   second means responsive to an output sample derived from said one of said first and second filter means during the first clock period of each one of said first and second time-multiplexed clock periods for feeding back that output sample through said one of said first and second filter means during the second clock period of that one of said first and second time-multiplexed clock periods.

6. The digital filter structure defined in claim 5, wherein said filter-reconfiguration means including multiplexer means in configuration (2) further comprises:
third means for (d) applying the value of each real input sample associated with the other of said first and second filter means as an input thereto during both of first and second time-multiplexed clock periods, (e) applying the value of each of a third group of said given number of real multiplier coefficients to a corresponding one of the first registers associated with the taps of said other filter means during each first clock period of said first and second time-multiplexed clock periods, and (f) applying the value of each of a fourth group of said given number of real multiplier coefficients to a corresponding one of the second registers associated with the taps of said other filter means during each second clock period of said first and second time-multiplexed clock periods; and
fourth means responsive to each output sample of said other of said first and second filter means during each first clock period of said first and second time-multiplexed clock periods for feeding back that output sample through said other of said first and second filter means during each second clock period of said first and second time-multiplexed clock periods.

7. The digital filter structure defined in claim 1, wherein said given number of multiplier-coefficient taps is three.

8. The digital filter structure defined in claim 1, wherein each of said first and second filter means includes means for inserting a programmable delay adjustable between a minimum and a maximum number of clock periods between adjacent taps thereof.

9. The digital filter structure defined in claim 8, wherein said programmable delay is adjustable between one and four clock periods.

10. The digital filter structure defined in claim 1, wherein said structure further includes third and fourth digital filter means and second filter-reconfiguration means including multiplexer means that correspond respectively to those first and second digital filter means and said filter-reconfiguration means including multiplexer means defined in claim 1; and wherein said combination further comprises:
cascading means for coupling an output of at least one of said first and second digital filter means to an input of a corresponding one of said third and fourth digital filter means to thereby provide a reconfigurable programmable digital filter having twice said given number of multiplier-coefficient taps.

11. The digital filter structure defined in claim 10, wherein:
said cascading means includes means for inserting a programmable bulk delay that is adjustable between a minimum and a maximum number of clock periods between said output of said one of said first and second digital filter means and said input of said corresponding one of said third and fourth digital filter means.

12. The digital filter structure defined in claim 10 wherein said cascading means comprises:
means for respectively coupling an output of each of said first and second digital filter means to an input of its corresponding one of said third and fourth digital filter means.

13. The digital filter structure defined in claim 12, wherein:
said cascading means includes separate means for inserting a programmable bulk delay that is independently adjustable between a minimum and a maximum number of clock periods between said output of each of said one of said first and second digital filter means and said input of its corresponding one of said third and fourth digital filter means.

14. A VLSI chip having a given chip structure for defining a reconfigurable programmable digital filter for a periodically sampled input signal; wherein each sample period is divided into two successive clock periods; and wherein said given chip structure comprises a first given plural number of filter substructures and a single IIR input and global substructure; and wherein:
each of said filter sub-structures includes a pair of first and second input-weighted digital filter means that each comprise (a) a second given plural number of taps, (b) two multiplier-accumulator registers between taps thereof and (c) first programmable delay means between taps thereof for introducing a sample delay that can be adjusted between first and second relatively small numbers of sample periods, means comprising programmable multiplexer means coupled to said digital filter means 1) for configuring each pair of first and second digital filter means as a single complex digital filter means with said second given plural number of complex multiplier coefficients for a complex sampled input signal applied thereto, or (2) for configuring at least one of said first and second digital filter means as a separate real digital filter unit with twice said second given plural number of real multiplier coefficients for a real sampled input signal applied thereto, and second programmable delay means for introducing a sample delay that can be adjusted between one clock period and a relatively large numbers of sample periods; and
said single IIR input and global sub-structure includes in-phase and quadrature-phase means for programmably adjusting the phase of samples applied as inputs thereto, and programmable routing multiplexers (1) for selectively applying the output of a certain one of said filter sub-structures as inputs to said in-phase and quadrature-phase means, and (2) for selectively cascading at least some of said first given plural number of filter sub-structures to alternatively configure said cascaded filter sub-structures as a certain real FIR or IIR filter, complex FIR or IIR filter, or a particular combination of real and complex FIR and/or IIR filters.

15. The VLSI chip defined in claim 14, wherein:
said given structure further comprises a chip cascade input and a chip cascade output; and
said programmable routing multiplexers further applies the filter output of the chip to the chip cascade output thereof.

16. The VLSI chip defined in claim 15, wherein:

said programmable multiplexer means of each of said filter sub-structures and said programmable routing multiplexers include means for operating them to provide a default-condition configuration in which said filter sections perform only as a delay line to pass data therethrough unchanged between the chip cascade input and the chip cascade output.

17. The VLSI circuit defined in claim 14 and further including
input means for providing said input signal to said digital filter; and
output means for receiving signals from said digital filter.

* * * * *